United States Patent
Okumura et al.

(10) Patent No.: US 12,098,319 B2
(45) Date of Patent: Sep. 24, 2024

(54) LIQUID CHEMICAL FOR FORMING WATER-REPELLENT PROTECTIVE FILM, METHOD FOR PREPARING SAME, AND METHOD FOR MANUFACTURING SURFACE-TREATED BODY

(71) Applicant: CENTRAL GLASS COMPANY, LIMITED, Ube (JP)

(72) Inventors: Yuzo Okumura, Ube (JP); Katsuya Kondo, Auderghem (BE); Shuhei Yamada, Ube (JP); Atsushi Ryokawa, Ichikawa (JP); Yuki Fukui, Ube (JP)

(73) Assignee: CENTRAL GLASS COMPANY, LIMITED, Ube (JP)

( * ) Notice: Subject to any disclaimer, the term of this patent is extended or adjusted under 35 U.S.C. 154(b) by 1099 days.

(21) Appl. No.: 16/962,159

(22) PCT Filed: Feb. 5, 2019

(86) PCT No.: PCT/JP2019/003964
§ 371 (c)(1),
(2) Date: Jul. 14, 2020

(87) PCT Pub. No.: WO2019/159748
PCT Pub. Date: Aug. 22, 2019

(65) Prior Publication Data
US 2020/0339850 A1    Oct. 29, 2020

(30) Foreign Application Priority Data

Feb. 13, 2018  (JP) ................................ 2018-022742
Jan. 10, 2019  (JP) ................................ 2019-002277

(51) Int. Cl.
*C09K 3/00*  (2006.01)
*C09K 3/18*  (2006.01)
(Continued)

(52) U.S. Cl.
CPC .............. *C09K 3/18* (2013.01); *H01L 21/304* (2013.01); *H01L 21/306* (2013.01)

(58) Field of Classification Search
None
See application file for complete search history.

(56) References Cited

U.S. PATENT DOCUMENTS

| | | | |
|---|---|---|---|
| 2005/0137324 A1* | 6/2005 | Roesler | .................. C09J 175/04 524/589 |
| 2010/0063222 A1 | 3/2010 | Oikawa et al. | |
| 2016/0369061 A1* | 12/2016 | Dinkar | .................. C08G 77/08 |

FOREIGN PATENT DOCUMENTS

| | | |
|---|---|---|
| EP | 0108512 | 5/1984 |
| EP | 0108512 A2 * | 5/1984 |
| JP | 2000-119642 | 4/2000 |
| JP | 2017-063179 | 3/2017 |

(Continued)

OTHER PUBLICATIONS

Office Action issued for Korean Patent Application No. 10-2020-7024720, May 26, 2022, 13 pages including English translation.
International Search Report of PCT/JP2019/003964, Mar. 12, 2019, 4 pages including English translation.

*Primary Examiner* — Stefanie J Cohen
(74) *Attorney, Agent, or Firm* — HSML P.C.

(57) ABSTRACT

The present invention is directed to a liquid chemical for forming a water-repellent protective film on a silicon element-containing wafer surface, a method of preparing the liquid chemical and a method of manufacturing a surface-treated body with the use of the liquid chemical, wherein the liquid chemical includes the following components: (I) a silylation agent; (II) at least one kind of nitrogen-containing compound selected from the group consisting of those of the following general formulas [1] and [2]; and (III) an organic solvent.

(Continued)

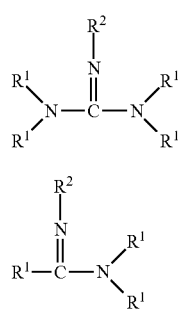

[1]

[2]

14 Claims, 2 Drawing Sheets

(51) Int. Cl.
    *H01L 21/304*     (2006.01)
    *H01L 21/306*     (2006.01)

(56) References Cited

FOREIGN PATENT DOCUMENTS

| KR | 1991-0004666 B1 | | 7/1991 |
|---|---|---|---|
| KR | 2017-0143469 | | 12/2017 |
| KR | 20170143469 A | * | 12/2017 |
| WO | 2008/072766 | | 6/2008 |

* cited by examiner

LIQUID CHEMICAL FOR FORMING WATER-REPELLENT PROTECTIVE FILM, METHOD FOR PREPARING SAME, AND METHOD FOR MANUFACTURING SURFACE-TREATED BODY

FIELD OF THE INVENTION

The present invention relates to a water-repellent protective film-forming liquid chemical for forming a water-repellent protective film on a surface of a wafer, a method of preparing the liquid chemical, and a method of manufacturing a surface-treated body with the use of the liquid chemical.

BACKGROUND ART

It is required that semiconductor devices for network applications and digital home appliances have higher performance, higher functionality and lower power consumption. Accordingly, the fine processing of circuit patterns has been pursued. With the fine processing of circuit patterns, however, the occurrence of pattern collapses in the circuit patterns is becoming a problem. The manufacturing of the semiconductor device makes great use of a cleaning process for removal of particles and metal impurities. Eventually, the cleaning process occupies 30 to 40% of the entire semiconductor manufacturing process. The pattern collapse is a phenomenon in which the pattern collapses due to the passage of a gas-liquid interface through the pattern after cleaning or rinsing in the cleaning process when the aspect ratio of the pattern becomes high with the fine patterning of the semiconductor device. The designs of the patterns have to be changed in order to prevent the occurrence of pattern collapses. Further, the occurrence of pattern collapses leads to a deterioration in manufacturing yield. It is thus demanded to develop a technique for preventing a pattern collapse during the cleaning process.

The formation of a water-repellent protective film on a surface of the pattern is known as an effective technique for preventing a pattern collapse. It is necessary to perform such water repellent treatment without drying the surface of the pattern. The water-repellent protective film is hence formed by replacing a cleaning liquid etc. with a water-repellent protective film-forming liquid chemical to impart water repellency to the surface of the pattern.

For example, Patent Document 1 discloses, as a surface treatment material capable of effectively preventing the occurrence of a pattern collapse in an inorganic pattern or resin pattern formed on a substrate, a surface treatment material for surface-treating a workpiece, wherein the surface treatment material includes a silylation agent and a silicon-free nitrogen-containing heterocyclic compound as a catalyst to promote reaction of the silylation agent.

PRIOR ART DOCUMENTS

Patent Documents

Patent Document 1: Japanese Laid-Open Patent Publication No. 2017-063179

SUMMARY OF THE INVENTION

Problems to be Solved by the Invention

Patterns on semiconductor wafers are formed from various materials (films). In recent years, the kinds of the films have had a tendency to increase. Under such a circumstance, there arises a compatibility problem that, depending on the acidity and basicity of a catalyst component contained in a treatment liquid, the treatment liquid cannot be applied for surface treatment of a wafer with a specific kind of film so as to prevent the occurrence of a pattern collapse on the wafer.

In the surface treatment material of Patent Document 1, the silicon-free nitrogen-containing heterocyclic compound is used as the catalyst of varying acidity/basicity to promote reaction of the silylation agent. It has been desired to ensure more options of liquid chemicals so as to be applicable to the combinations of the film kinds which are expected to increase in the future as mentioned above. There has thus been a demand to develop treatment liquids containing new catalyst components of varying acidity/basicity.

In view of the foregoing, it is an object of the present invention to provide a novel water-repellent protective film-forming liquid chemical (hereinafter also simply referred to as "protective film-forming liquid chemical" or "liquid chemical") containing a new catalyst component of varying basicity, a method of preparing the liquid chemical, and a method of manufacturing a surface-treated body with the use of the liquid chemical.

Means for Solving the Problems

One aspect of the present invention is a water-repellent protective film-forming liquid chemical for forming a water-repellent protective film on a silicon element-containing surface of a wafer, comprising the following components:
(I) a silylation agent;
(II) at least one kind of nitrogen-containing compound selected from the group consisting of those of the following general formulas [1] and [2]; and
(III) an organic solvent.

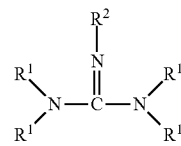

[1]

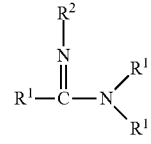

[2]

In the general formulas [1] and [2], $R^1$ is each independently a hydrogen atom, a —C≡N group, a —NO$_2$ group, or a hydrocarbon group in which a part or all of hydrogen atoms may be substituted with a fluorine atom; the hydrocarbon group as $R^1$ may contain an oxygen atom and/or a nitrogen atom and, when containing a nitrogen atom, has an acyclic structure; $R^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as $R^2$ may contain an oxygen atom and/or a nitrogen atom and, when containing a nitrogen atom, has an acyclic structure.

Preferably, the component (II) is liquid at 25° C. and 1.0 atmospheric pressure in terms of the cleanliness of the liquid chemical.

In terms of the water repellency imparting effect, the silylation agent preferably contains at least one kind selected from the group consisting of compounds of the following general formulas [3] to [6].

$(R^3)_a(H)_b Si[OC(=O)R^4]_{4-a-b}$ [3]

In the general formula [3], $R^3$ is each independently a monovalent hydrocarbon group of 1 to 18 carbon atoms in which a part or all of hydrogen atoms may be substituted with a fluorine atom; $R^4$ is each independently an alkyl group of 1 to 6 carbon atoms in which a part or all of hydrogen atoms may be substituted with a fluorine atom; a is an integer of 1 to 3; b is an integer of 0 to 2; and the sum of a and b is 3 or less.

$(R^5)_c(H)_d Si[N(R^6)C(=O)R^7]_{4-c-d}$ [4]

In the general formula [4], $R^5$ is each independently a monovalent hydrocarbon group of 1 to 18 carbon atoms in which a part or all of hydrogen atoms may be substituted with a fluorine atom; $R^1$ is each independently an alkyl group of 1 to 6 carbon atoms in which a part or all of hydrogen atoms may be substituted with a fluorine atom, or a hydrogen atom; $R^7$ is each independently an alkyl group of 1 to 6 carbon atoms in which a part or all of hydrogen atoms may be substituted with a fluorine atom; c is an integer of 1 to 3; d is an integer of 0 to 2; and the sum of c and d is 3 or less.

$(R^8)_e(H)_f SiN=C(R^9)OSi(H)_g(R^{10})_h$ [5]

In the general formula [5], $R^8$ and $R^{10}$ are each independently a monovalent hydrocarbon group of 1 to 18 carbon atoms in which a part or all of hydrogen atoms may be substituted with a fluorine atom; $R^9$ is an alkyl group of 1 to 6 carbon atoms in which a part or all of hydrogen atoms may be substituted with a fluorine atom, or a hydrogen atom; and e and h are each an integer of 1 to 3; f and g are each an integer of 0 to 2; and the sum of e and f and the sum of g and h are both 3.

$(R^{11})_i(H)_j Si—Y$ [6]

In the general formula [6], $R^{11}$ is each independently a monovalent hydrocarbon group of 1 to 18 carbon atoms in which a part or all of hydrogen atoms may be substituted with a fluorine atom; i is an integer of 1 to 3; j is an integer of 0 to 2; the sum of i and j is 3; Y is a monovalent nitrogen-containing heterocyclic group which may have a substituent.

Preferably, the silylation agent further contains at least one kind selected from the group consisting of compounds of the following general formula [7] in terms of the water repellency imparting effect.

$[(R^{12})_k(H)_l Si]_2 NH$ [7]

In the general formula [7], $R^{12}$ is each independently a monovalent hydrocarbon group of 1 to 18 carbon atoms in which a part or all of hydrogen atoms may be substituted with a fluorine atom; k is an integer of 1 to 3; l is an integer of 0 to 2; and the sum of k and l is 3.

The concentration of the component (II) is preferably 0.01 to 30 mass % based on 100 mass % of the total amount of the components (I) to (III) so as to facilitate uniform formation of the protective film on the silicon element-containing wafer surface.

In terms of the water repellency imparting effect, it is preferable that $R^1$ in the general formulas [1] and [2] is a hydrogen atom, an alkyl group of 1 to 6 carbon atoms, or an alkoxy group of 1 to 6 carbon atoms; and $R^2$ in the general formulas [1] and [2] is a hydrogen atom, an alkyl group of 1 to 6 carbon atoms, an alkoxy group of 1 to 6 carbon atoms, or an alkylsilyl group of the following general formula [8].

$—[Si(R^{13})_m(H)_n]$ [8]

In the general formula [8], $R^{13}$ is each independently a hydrocarbon group of 1 to 18 carbon atoms; m and n are each an integer of 0 to 3; and the sum of m and n is 3.

In terms of the water repellency imparting effect, the component (II) preferably contains at least one kind of nitrogen-containing compound selected from the group consisting of those of the general formula [1].

To readily maintain water repellency during the after-mentioned cleaning process after the formation of the protective film, it is preferable that a in the general formula [3], c in the general formula [4], e and h in the general formula [5] and i in the general formula [6] are 3. In the case where the sililation agent contains the compound of the general formula [7], it is preferable that k in the general formula [7] is 3 to readily maintain water repellency during the after-mentioned cleaning process after the formation of the protective film.

To uniformly form the protective film, it is preferable that: at least two of $R^3$ in the general formula [3] are methyl; at least two of $R^5$ in the general formula [4] are methyl; in the general formula [5], at least two of $R^8$ are methyl, and at least two of $R^{10}$ are methyl; and at least two of $R^{11}$ in the general formula [6] are methyl. In the case where the sililation agent contains the compound of the general formula [7], it is preferable that at least two of $R^{12}$ in the general formula [7] are methyl to uniformly form the protective film.

Further, the concentration of the component (I) is preferably 1 to 50 mass % based on 100 mass % of the total amount of the components (I) to (III) so as to facilitate uniform formation of the protective film on the silicon element-containing wafer surface.

In terms of the stability of the liquid chemical, the organic solvent as the component (III) is preferably an aprotic solvent.

Another aspect of the present invention is a method of preparing a water-repellent protective film-forming liquid chemical for forming a water-repellent protective film on a silicon element-containing surface of a wafer, comprising mixing at least the following components under conditions of 15 to 35° C. and 0.5 to 1.5 atmospheric pressure,
(I) a silylation agent;
(II) at least one kind of nitrogen-containing compound selected from the group consisting of those of the following general formulas [1] and [2]; and
(III) an organic solvent.

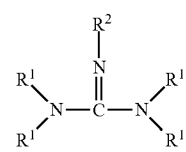

[1]

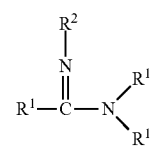

[2]

In the general formulas [1] and [2], $R^1$ is each independently a hydrogen atom, a —C≡N group, a —NO$_2$ group, or a hydrocarbon group in which a part or all of hydrogen atoms may be substituted with a fluorine atom; the hydrocarbon group as $R^1$ may contain an oxygen atom and/or a nitrogen atom and, when containing a nitrogen atom, has an acyclic structure; $R^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as $R^2$ may contain an oxygen atom and/or a nitrogen atom and, when containing a nitrogen atom, has an acyclic structure.

To prevent deterioration of the liquid chemical, it is preferable that the preparation of the liquid chemical is performed in an atmosphere of an inert gas such as nitrogen gas or argon gas. In this case, the pressure condition is preferably 0.5 to 1.5 atmospheric pressure, more preferably 1.0 to 1.5 atmospheric pressure.

Still another aspect of the present invention is a method of manufacturing a surface-treated body, comprising surface-treating a workpiece by bringing the above-mentioned water-repellent protective film-forming liquid chemical into contact with a surface of the workpiece.

Effects of the Invention

The water-repellent protective film-forming liquid chemical according to the present invention achieves a good water repellency imparting effect and good raw material solubility in a well-balanced manner, and ensures a new choice of options against the ever-increasing large number of combinations of semiconductor wafer configurations.

DETAILED DESCRIPTION OF THE EMBODIMENTS

1. Water-Repellent Protective Film-Forming Liquid Chemical

Figure 1:
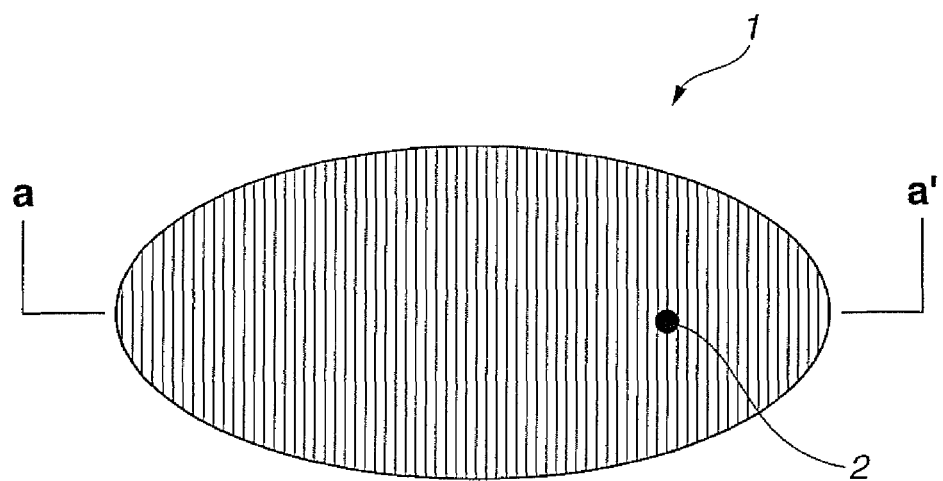
FIG. 1 is a schematic perspective view of a wafer 1 having on a surface thereof a fine uneven pattern 2.

The water-repellent protective film-forming liquid chemical according to the present invention includes the following components:
(I) a silylation agent;
(II) at least one kind of nitrogen-containing compound selected from the group consisting of those of the above-indicated general formulas [1] and [2]; and
(III) an organic solvent.

Component (I): Silylation Agent

There is no particular limitation on the silylation agent used in the present invention. Any known silylation agent can be used. The silylation agent reacts with a silicon element-containing wafer surface to form a water-repellent protective film on the wafer surface. The water-repellent protective film may be formed of the silylation agent or may include a reaction product containing the silylation agent as a predominant component.

Preferably, the silylation agent contains at least one kind selected from the group consisting of compounds of the above-indicated general formulas [3] to [6] in terms of the water repellency imparting effect.

Specific examples of the silylation agent compound of the general formula [3] include: trifluoroacetoxysilanes such as $CH_3Si[OC(=O)CF_3]_3$, $C_2H_5Si[OC(=O)CF_3]_3$, $C_3H_7Si[OC(=O)CF_3]_3$, $C_4H_9Si[OC(=O)CF_3]_3$, $C_5H_{11}Si[OC(=O)CF_3]_3$, $C_6H_{13}Si[OC(=O)CF_3]_3$, $C_7H_{15}Si[OC(=O)CF_3]_3$, $C_8H_{17}Si[OC(=O)CF_3]_3$, $C_9H_{19}Si[OC(=O)CF_3]_3$, $C_{10}H_{21}Si[OC(=O)CF_3]_3$, $C_{11}H_{23}Si[OC(=O)CF_3]_3$, $C_{12}H_{25}Si[OC(=O)CF_3]_3$, $C_{13}H_{27}Si[OC(=O)CF_3]_3$, $C_{14}H_{29}Si[OC(=O)CF_3]_3$, $C_{15}H_{31}Si[OC(=O)CF_3]_3$, $C_{16}H_{33}Si[OC(=O)CF_3]_3$, $C_{17}H_{35}Si[OC(=O)CF_3]_3$, $C_{18}H_{37}Si[OC(=O)CF_3]_3$, $(CH_3)_2Si[OC(=O)CF_3]_2$, $C_2H_5Si(CH_3)[OC(=O)CF_3]_2$, $(C_2H_5)_2Si[OC(=O)CF_3]_2$, $C_3H_7Si(CH_3)[OC(=O)CF_3]_2$, $(C_3H_7)_2Si[OC(=O)CF_3]_2$, $C_4H_9Si(CH_3)[OC(=O)CF_3]_2$, $(C_4H_9)_2Si[OC(=O)CF_3]_2$, $C_5H_{11}Si(CH_3)[OC(=O)CF_3]_2$, $C_6H_{13}Si(CH_3)[OC(=O)CF_3]_2$, $C_7H_{15}Si(CH_3)[OC(=O)CF_3]_2$, $C_5H_{17}Si(CH_3)[OC(=O)CF_3]_2$, $C_9H_{19}Si(CH_3)[OC(=O)CF_3]_2$, $C_{10}H_{21}Si(CH_3)[OC(=O)CF_3]_2$, $C_{11}H_{23}Si(CH_3)[OC(=O)CF_3]_2$, $C_{12}H_{25}Si(CH_3)[OC(=O)CF_3]_2$, $C_{13}H_{27}Si(CH_3)[OC(=O)CF_3]_2$, $C_{14}H_{29}Si(CH_3)[OC(=O)CF_3]_2$, $C_{15}H_{31}Si(CH_3)[OC(=O)CF_3]_2$, $C_{16}H_{33}Si(CH_3)[OC(=O)CF_3]_2$, $C_{17}H_{35}Si(CH_3)[OC(=O)CF_3]_2$, $C_{18}H_{37}Si(CH_3)[OC(=O)CF_3]_2$, $(CH_3)_3SiOC(=O)CF_3$, $C_2H_5Si(CH_3)_2OC(=O)CF_3$, $(C_2H_5)_2Si(CH_3)OC(=O)CF_3$, $(C_2H_5)_3SiOC(=O)CF_3$, $C_3H_7Si(CH_3)_2OC(=O)CF_3$, $(C_3H_7)_2Si(CH_3)OC(=O)CF_3$, $(C_3H_7)_3SiOC(=O)CF_3$, $C_4H_9Si(CH_3)_2OC(=O)CF_3$, $(C_4H_9)_3SiOC(=O)CF_3$, $C_5H_{11}Si(CH_3)_2OC(=O)CF_3$, $C_6H_{13}Si(CH_3)_2OC(=O)CF_3$, $C_7H_{15}Si(CH_3)_2OC(=O)CF_3$, $C_8H_{17}Si(CH_3)_2OC(=O)CF_3$, $C_9H_{19}Si(CH_3)_2OC(=O)CF_3$, $C_{10}H_{21}Si(CH_3)_2OC(=O)CF_3$, $C_{11}H_{23}Si(CH_3)_2OC(=O)CF_3$, $C_{12}H_{25}Si(CH_3)_2OC(=O)CF_3$, $C_{13}H_{27}Si(CH_3)_2OC(=O)CF_3$, $C_{14}H_{29}Si(CH_3)_2OC(=O)CF_3$, $C_{15}H_{31}Si(CH_3)_2OC(=O)CF_3$, $C_{16}H_{33}Si(CH_3)_2OC(=O)CF_3$, $C_{17}H_{35}Si(CH_3)_2OC(=O)CF_3$, $C_{18}H_{37}Si(CH_3)_2OC(=O)CF_3$, $(CH_3)_2Si(H)OC(=O)CF_3$, $CH_3Si(H)_2OC(=O)CF_3$, $(C_2H_5)_2Si(H)OC(=O)CF_3$, $C_2H_5Si(H)_2OC(=O)CF_3$, $C_2H_5Si(CH_3)(H)OC(=O)CF_3$, $(C_3H_7)_2Si(H)OC(=O)CF_3$, $C_3H_7Si(H)_2OC(=O)CF_3$, $CF_3CH_2CH_2Si[OC(=O)CF_3]_3$, $C_2F_5CH_2CH_2Si[OC(=O)CF_3]_3$, $C_3F_7CH_2CH_2Si[OC(=O)CF_3]_3$, $C_4F_9CH_2CH_2Si[OC(=O)CF_3]_3$, $C_5F_{11}CH_2CH_2Si[OC(=O)CF_3]_3$, $C_6F_{13}CH_2CH_2Si[OC(=O)CF_3]_3$, $C_7F_{15}CH_2CH_2Si[OC(=O)CF_3]_3$, $C_8F_{17}CH_2CH_2Si[OC(=O)CF_3]_3$, $CF_3CH_2CH_2Si(CH_3)[OC(=O)CF_3]_2$, $C_2F_5CH_2CH_2Si(CH_3)[OC(=O)CF_3]_2$, $C_3F_7CH_2CH_2Si(CH_3)[OC(=O)CF_3]_2$, $C_4F_9CH_2CH_2Si(CH_3)[OC(=O)CF_3]_2$, $C_5F_{11}CH_2CH_2Si(CH_3)[OC(=O)CF_3]_2$, $C_6F_{13}CH_2CH_2Si(CH_3)[OC(=O)CF_3]_2$, $C_7F_{15}CH_2CH_2Si(CH_3)[OC(=O)CF_3]_2$, $C_8F_{17}CH_2CH_2Si(CH_3)[OC(=O)CF_3]_2$, $CF_3CH_2CH_2Si(CH_3)_2OC(=O)CF_3$, $C_2F_5CH_2CH_2Si(CH_3)_2OC(=O)CF_3$, $C_3F_7CH_2CH_2Si(CH_3)_2OC(=O)CF_3$, $C_4F_9CH_2CH_2Si(CH_3)_2OC(=O)CF_3$, $C_5F_{11}CH_2CH_2Si(CH_3)_2OC(=O)CF_3$, $C_6F_{13}CH_2CH_2Si(CH_3)_2OC(=O)CF_3$, $C_7F_{15}CH_2CH_2Si(CH_3)_2OC(=O)CF_3$, $C_8F_{17}CH_2CH_2Si(CH_3)_2OC(=O)CF_3$ and $CF_3CH_2CH_2Si(CH_3)(H)OC(=O)CF_3$; and those obtained by replacing —OC(=O)CF$_3$ groups of the aforementioned trifluoroacetoxysilanes with a —OC(=O)R$^4$ group other than —OC(=O)CF$_3$ (where R$^4$ is an alkyl group of 1 to 6 carbon atoms in which a part or all of hydrogen atoms may be substituted with fluorine).

In terms of the water repellency imparting effect, $R^4$ of the —OCOR$^4$ group is preferably an alkyl group in which all of hydrogen atoms are substituted with fluorine. The alkyl group is more preferably of 1 to 4 carbon atoms, particularly preferably 1 carbon atom.

The number of —OC(=O)R$^4$ groups as represented by 4-a-b in the general formula [3] is preferably 1 so as to facilitate uniform formation of the protective film.

Further, b in the general formula [3] is preferably 0 so as to readily maintain water repellency during the after-mentioned cleaning process after the formation of the protective film.

The combination of two CH$_3$ groups and one linear alkyl group is preferable as $R^3$ so as to facilitate uniform formation of the protective film.

Specific examples of the silylation agent compound of the general formula [4] include: N-methyl-N-alkylsilyltrifluoroacetamides such as CH$_3$Si[N(CH$_3$)C(=O)CF$_3$]$_3$, C$_2$H$_5$Si[N(CH$_3$)C(=O)CF$_3$]$_3$, C$_3$H$_7$Si[N(CH$_3$)C(=O)CF$_3$]$_3$, C$_4$H$_9$Si[N(CH$_3$)C(=O)CF$_3$]$_3$, C$_5$H$_{11}$Si[N(CH$_3$)C(=O)CF$_3$]$_3$, C$_6$H$_{13}$Si[N(CH$_3$)C(=O)CF$_3$]$_3$, C$_7$H$_{15}$Si[N(CH$_3$)C(=O)CF$_3$]$_3$, C$_8$H$_7$Si[N(CH$_3$)C(=O)CF$_3$]$_3$, C$_9$H$_{19}$Si[N(CH$_3$)C(=O)CF$_3$]$_3$, C$_{10}$H$_{21}$Si[N(CH$_3$)C(=O)CF$_3$]$_3$, C$_{11}$H$_{23}$Si[N(CH$_3$)C(=O)CF$_3$]$_3$, C$_{12}$H$_{25}$Si[N(CH$_3$)C(=O)CF$_3$]$_3$, C$_{13}$H$_{27}$Si[N(CH$_3$)C(=O)CF$_3$]$_3$, C$_{14}$H$_{29}$Si[N(CH$_3$)C(=O)CF$_3$]$_3$, C$_{15}$H$_{31}$Si[N(CH$_3$)C(=O)CF$_3$]$_3$, C$_{16}$H$_{33}$Si[N(CH$_3$)C(=O)CF$_3$]$_3$, C$_{17}$H$_{35}$Si[N(CH$_3$)C(=O)CF$_3$]$_3$, C$_{18}$H$_{37}$Si[N(CH$_3$)C(=O)CF$_3$]$_3$, (CH$_3$)$_2$Si[N(CH$_3$)C(=O)CF$_3$]$_2$, C$_2$H$_5$Si(CH$_3$)[N(CH$_3$)C(=O)CF$_3$]$_2$, (C$_2$H$_5$)$_2$Si[N(CH$_3$)C(=O)CF$_3$]$_2$, C$_3$H$_7$Si(CH$_3$)[N(CH$_3$)C(=O)CF$_3$]$_2$, (C$_3$H$_7$)$_2$Si[N(CH$_3$)C(=O)CF$_3$]$_2$, C$_4$H$_9$Si(CH$_3$)[N(CH$_3$)C(=O)CF$_3$]$_2$, (C$_4$H$_9$)$_2$Si[N(CH$_3$)C(=O)CF$_3$]$_2$, C$_5$H$_{11}$Si(CH$_3$)[N(CH$_3$)C(=O)CF$_3$]$_2$, C$_6$H$_{13}$Si(CH$_3$)[N(CH$_3$)C(=O)CF$_3$]$_2$, C$_7$H$_{15}$Si(CH$_3$)[N(CH$_3$)C(=O)CF$_3$]$_2$, C$_8$H$_{17}$Si(CH$_3$)[N(CH$_3$)C(=O)CF$_3$]$_2$, C$_9$H$_{19}$Si(CH$_3$)[N(CH$_3$)C(=O)CF$_3$]$_2$, C$_{10}$H$_{21}$Si(CH$_3$)[N(CH$_3$)C(=O)CF$_3$]$_2$, C$_{11}$H$_{23}$Si(CH$_3$)[N(CH$_3$)C(=O)CF$_3$]$_2$, C$_{12}$H$_{25}$Si(CH$_3$)[N(CH$_3$)C(=O)CF$_3$]$_2$, C$_{13}$H$_{27}$Si(CH$_3$)[N(CH$_3$)C(=O)CF$_3$]$_2$, C$_{14}$H$_{29}$Si(CH$_3$)[N(CH$_3$)C(=O)CF$_3$]$_2$, C$_{15}$H$_{31}$Si(CH$_3$)[N(CH$_3$)C(=O)CF$_3$]$_2$, C$_{16}$H$_{33}$Si(CH$_3$)[N(CH$_3$)C(=O)CF$_3$]$_2$, C$_{17}$H$_{35}$Si(CH$_3$)[N(CH$_3$)C(=O)CF$_3$]$_2$, C$_{18}$H$_{37}$Si(CH$_3$)[N(CH$_3$)C(=O)CF$_3$]$_2$, (CH$_3$)$_3$SiN(CH$_3$)C(=O)CF$_3$, C$_2$H$_5$Si(CH$_3$)$_2$N(CH$_3$)C(=O)CF$_3$, (C$_2$H$_5$)$_2$Si(CH$_3$)N(CH$_3$)C(=O)CF$_3$, (C$_2$H$_5$)$_3$SiN(CH$_3$)C(=O)CF$_3$, C$_3$H$_7$Si(CH$_3$)$_2$N(CH$_3$)C(=O)CF$_3$, (C$_3$H$_7$)$_2$Si(CH$_3$)N(CH$_3$)C(=O)CF$_3$, (C$_3$H$_7$)$_3$SiN(CH$_3$)C(=O)CF$_3$, C$_4$H$_9$Si(CH$_3$)$_2$N(CH$_3$)C(=O)CF$_3$, (C$_4$H$_9$)$_3$SiN(CH$_3$)C(=O)CF$_3$, C$_5$H$_{11}$Si(CH$_3$)$_2$N(CH$_3$)C(=O)CF$_3$, C$_6$H$_{13}$Si(CH$_3$)$_2$N(CH$_3$)C(=O)CF$_3$, C$_7$H$_{15}$Si(CH$_3$)$_2$N(CH$_3$)C(=O)CF$_3$, C$_8$H$_{17}$Si(CH$_3$)$_2$N(CH$_3$)C(=O)CF$_3$, C$_9$H$_{19}$Si(CH$_3$)$_2$N(CH$_3$)C(=O)CF$_3$, C$_{10}$H$_{21}$Si(CH$_3$)$_2$N(CH$_3$)C(=O)CF$_3$, C$_{11}$H$_{23}$Si(CH$_3$)$_2$N(CH$_3$)C(=O)CF$_3$, C$_{12}$H$_{25}$Si(CH$_3$)$_2$N(CH$_3$)C(=O)CF$_3$, C$_{13}$H$_{27}$Si(CH$_3$)$_2$N(CH$_3$)C(=O)CF$_3$, C$_{14}$H$_{29}$Si(CH$_3$)$_2$N(CH$_3$)C(=O)CF$_3$, C$_{15}$H$_{31}$Si(CH$_3$)$_2$N(CH$_3$)C(=O)CF$_3$, C$_{16}$H$_{33}$Si(CH$_3$)$_2$N(CH$_3$)C(=O)CF$_3$, C$_{17}$H$_{35}$Si(CH$_3$)$_2$N(CH$_3$)C(=O)CF$_3$, C$_{18}$H$_{37}$Si(CH$_3$)$_2$N(CH$_3$)C(=O)CF$_3$, (CH$_3$)$_2$Si(H)N(CH$_3$)C(=O)CF$_3$, CH$_3$Si(H)$_2$N(CH$_3$)C(=O)CF$_3$, (C$_2$H$_5$)$_2$Si(H)N(CH$_3$)C(=O)CF$_3$, C$_2$H$_5$Si(H)$_2$N(CH$_3$)C(=O)CF$_3$, C$_2$H$_5$Si(CH$_3$)(H)N(CH$_3$)C(=O)CF$_3$, (C$_3$H$_7$)$_2$Si(H)N(CH$_3$)C(=O)CF$_3$, C$_3$H$_7$Si(H)$_2$N(CH$_3$)C(=O)CF$_3$, CF$_3$CH$_2$CH$_2$Si[N(CH$_3$)C(=O)CF$_3$]$_3$, C$_2$F$_5$CH$_2$CH$_2$Si[N(CH$_3$)C(=O)CF$_3$]$_3$, C$_3$F$_7$CH$_2$CH$_2$Si[N(CH$_3$)C(=O)CF$_3$]$_3$, C$_4$F$_9$CH$_2$CH$_2$Si[N(CH$_3$)C(=O)CF$_3$]$_3$, C$_5$F$_{11}$CH$_2$CH$_2$Si[N(CH$_3$)C(=O)CF$_3$]$_3$, C$_6$F$_{13}$CH$_2$CH$_2$Si[N(CH$_3$)C(=O)CF$_3$]$_3$, C$_7$F$_{15}$CH$_2$CH$_2$Si[N(CH$_3$)C(=O)CF$_3$]$_3$, C$_8$F$_{17}$CH$_2$CH$_2$Si[N(CH$_3$)C(=O)CF$_3$]$_3$, CF$_3$CH$_2$CH$_2$Si(CH$_3$)[N(CH$_3$)C(=O)CF$_3$]$_2$, C$_2$F$_5$CH$_2$CH$_2$Si(CH$_3$)[N(CH$_3$)C(=O)CF$_3$]$_2$, C$_3$F$_7$CH$_2$CH$_2$Si(CH$_3$)[N(CH$_3$)C(=O)CF$_3$]$_2$, C$_4$F$_9$CH$_2$CH$_2$Si(CH$_3$)[N(CH$_3$)C(=O)CF$_3$]$_2$, C$_5$F$_{11}$CH$_2$CH$_2$Si(CH$_3$)[N(CH$_3$)C(=O)CF$_3$]$_2$, C$_6$F$_{13}$CH$_2$CH$_2$Si(CH$_3$)[N(CH$_3$)C(=O)CF$_3$]$_2$, C$_7$F$_{15}$CH$_2$CH$_2$Si(CH$_3$)[N(CH$_3$)C(=O)CF$_3$]$_2$, C$_8$F$_{17}$CH$_2$CH$_2$Si(CH$_3$)[N(CH$_3$)C(=O)CF$_3$]$_2$, CF$_3$CH$_2$CH$_2$Si(CH$_3$)$_2$N(CH$_3$)C(=O)CF$_3$, C$_2$F$_5$CH$_2$CH$_2$Si(CH$_3$)$_2$N(CH$_3$)C(=O)CF$_3$, C$_3$F$_7$CH$_2$CH$_2$Si(CH$_3$)$_2$N(CH$_3$)C(=O)CF$_3$, C$_4$F$_9$CH$_2$CH$_2$Si(CH$_3$)$_2$N(CH$_3$)C(=O)CF$_3$, C$_5$F$_{11}$CH$_2$CH$_2$Si(CH$_3$)$_2$N(CH$_3$)C(=O)CF$_3$, C$_6$F$_{13}$CH$_2$CH$_2$Si(CH$_3$)$_2$N(CH$_3$)C(=O)CF$_3$, C$_7$F$_{15}$CH$_2$CH$_2$Si(CH$_3$)$_2$N(CH$_3$)C(=O)CF$_3$, C$_8$F$_{17}$CH$_2$CH$_2$Si(CH$_3$)$_2$N(CH$_3$)C(=O)CF$_3$ and CF$_3$CH$_2$CH$_2$Si(CH$_3$)(H)N(CH$_3$)C(=O)CF$_3$; and those obtained by replacing —N(CH$_3$)C(=O)CF$_3$ groups of the aforementioned N-methyl-N-alkylsilyltrifluoroacetamides with a —N(CH$_3$)C(=O)R$^7$ group other than —N(CH$_3$)C(=O)CF$_3$ (where R$^7$ is an alkyl group of 1 to 6 carbon atoms in which a part or all of hydrogen atoms may be substituted with fluorine). There can also be used those obtained by replacing methyl of the —N(CH$_3$)C(=O)R$^7$ groups of the above-exemplified compounds with hydrogen, ethyl, propyl, butyl, trifluoromethyl, pentafluoroethyl, heptafluoropropyl, nonafluorobutyl etc.

In terms of the water repellency imparting effect, R$^7$ of the —N(R$^6$)C(=O)R$^7$ group is preferably an alkyl group in which all of hydrogen atoms are substituted with fluorine. The alkyl group is more preferably of 1 to 4 carbon atoms, particularly preferably 1 carbon atom.

The number of —N(R$^6$)C(=O)R$^7$ groups as represented by 4-c-d in the general formula [4] is preferably 1 so as to facilitate uniform formation of the protective film.

Further, d in the general formula [4] is preferably 0 so as to readily maintain water repellency during the after-mentioned cleaning process after the formation of the protective film.

The combination of two CH$_3$ groups and one linear alkyl group is preferable as R$^5$ so as to facilitate uniform formation of the protective film.

Specific examples of the silylation agent compound of the general formula [5] include: bis-(alkylsilyl)acetamides such as (CH$_3$)$_3$SiN=C(CH$_3$)OSi(CH$_3$)$_3$, C$_2$H$_5$Si(CH$_3$)$_2$N=C(CH$_3$)O(CH$_3$)$_2$SiC$_2$H$_5$, (C$_2$H$_5$)$_2$Si(CH$_3$)N=C(CH$_3$)O(CH$_3$)Si(C$_2$H$_5$)$_2$, (C$_2$H$_5$)$_3$SiN=C(CH$_3$)OSi(C$_2$H$_5$)$_3$, C$_3$H$_7$Si(CH$_3$)$_2$N=C(CH$_3$)(CH$_3$)$_2$SiC$_3$H$_7$, (C$_3$H$_7$)$_2$Si(CH$_3$)N=C(CH$_3$)O(CH$_3$)Si(C$_3$H$_7$)$_2$, (C$_3$H$_7$)$_3$SiN=C(CH$_3$)OS(C$_3$H$_7$)$_3$, C$_4$H$_9$Si(CH$_3$)$_2$N=C(CH$_3$)O(CH$_3$)$_2$SiC$_4$H$_9$, (C$_4$H$_9$)$_3$SiN=C(CH$_3$)OSi(C$_4$H$_9$)$_3$, C$_5$H$_{11}$Si(CH$_3$)$_2$N=C(CH$_3$)O(CH$_3$)$_2$SiC$_5$H$_{11}$, CH$_3$Si(CH$_3$)$_2$N=C(CH$_3$)O(CH$_3$)$_2$SiC$_6$H$_3$, C$_7$H$_{15}$Si(CH$_3$)$_2$N=C(CH$_3$)O(CH$_3$)$_2$SiC$_7$H$_{15}$, C$_8$H$_{17}$Si(CH$_3$)$_2$N=C(CH$_3$)O(CH$_3$)$_2$SiC$_8$H$_{17}$, C$_9$H$_{19}$Si(CH$_3$)$_2$N=C(CH$_3$)O(CH$_3$)$_2$SiC$_9$H$_{19}$, C$_{10}$H$_{21}$Si(CH$_3$)$_2$N=C(CH$_3$)O(CH$_3$)$_2$SiC$_{10}$H$_{21}$, C$_{11}$H$_{23}$Si(CH$_3$)$_2$N=C(CH$_3$)O(CH$_3$)$_2$SiC$_{11}$H$_{23}$, C$_{12}$H$_{25}$Si(CH$_3$)$_2$N=C(CH$_3$)O(CH$_3$)$_2$SiC$_{12}$H$_{25}$, C$_{13}$H$_{27}$Si(CH$_3$)$_2$N=C(CH$_3$)O(CH$_3$)$_2$SiC$_{13}$H$_{27}$, C$_{14}$H$_{29}$Si(CH$_3$)$_2$N=C(CH$_3$)O(CH$_3$)$_2$SiC$_{14}$H$_{29}$, C$_{15}$H$_{31}$Si(CH$_3$)$_2$N=C(CH$_3$)O(CH$_3$)$_2$SiC$_{15}$H$_{31}$, C$_{16}$H$_{33}$Si(CH$_3$)$_2$N=C(CH$_3$)O(CH$_3$)$_2$SiC$_{16}$H$_{33}$, C$_{17}$H$_{35}$Si(CH$_3$)$_2$N=C(CH$_3$)O(CH$_3$)$_2$SiC$_{17}$H$_{35}$, C$_{18}$H$_{37}$Si(CH$_3$)$_2$N=C(CH$_3$)O(CH$_3$)$_2$SiC$_{18}$H$_{37}$, (CH$_3$)$_2$Si(H)N=C(CH$_3$)O(H)Si(CH$_3$)$_2$, CH$_3$Si(H)$_2$N=C(CH$_3$)O(H)$_2$SiCH$_3$, (C$_2$H$_5$)$_2$Si(H)N=C(CH$_3$)O(H)Si(C$_2$H$_5$)$_2$, C$_2$H$_5$Si(H)$_2$N=C(CH$_3$)O(H)$_2$SiC$_2$H$_5$, C$_2$H$_5$Si(CH$_3$)(H)N=C(CH$_3$)O(CH$_3$)(H)SiC$_2$H$_5$, (C$_3$H$_7$)$_2$Si(H)N=C(CH$_3$)O(H)Si(C$_3$H$_7$)$_2$, C$_3$H$_7$Si(H)$_2$N=C(CH$_3$)O(H)$_2$SiC$_3$H$_7$, CF$_3$CH$_2$CH$_2$Si(CH$_3$)$_2$N=C(CH$_3$)O(CH$_3$)$_2$SiCH$_2$CH$_2$CF$_3$, C$_2$F$_5$CH$_2$CH$_2$Si(CH$_3$)$_2$N=C(CH$_3$)O(CH$_3$)$_2$SiCH$_2$CH$_2$C$_2$F$_5$, C$_3$F$_7$CH$_2$CH$_2$Si(CH$_3$)$_2$N=C(CH$_3$)

O(CH$_3$)$_2$SiCH$_2$CH$_2$C$_3$F$_7$, C$_4$F$_9$CH$_2$CH$_2$Si(CH$_3$)$_2$N=C(CH$_3$)O(CH$_3$)$_2$SiCH$_2$CH$_2$C$_4$F$_9$, C$_5$F$_{11}$CH$_2$CH$_2$Si(CH$_3$)$_2$N=C(CH$_3$)O(CH$_3$)$_2$SiCH$_2$CH$_2$C$_5$F$_{11}$, C$_6$F$_{113}$CH$_2$CH$_2$Si(CH$_3$)$_2$N=C(CH$_3$)O(CH$_3$)$_2$SiCH$_2$CH$_2$C$_6$F$_{13}$, C$_7$F$_{15}$CH$_2$CH$_2$Si(CH$_3$)$_2$N=C(CH$_3$)O(CH$_3$)$_2$SiCH$_2$CH$_2$C$_7$F$_{15}$, C$_8$F$_{17}$CH$_2$CH$_2$Si(CH$_3$)$_2$N=C(CH$_3$)O(CH$_3$)$_2$SiCH$_2$CH$_2$C$_8$F$_{17}$ and CF$_3$CH$_2$CH$_2$Si(CH$_3$)(H)N=C(CH$_3$)O(CH$_3$)(H)SiCH$_2$CH$_2$CF$_3$. There can also be used those obtained by replacing methyl of —N=C(CH$_3$)O— groups of the above-exemplified compounds with hydrogen, ethyl, propyl, butyl, trifluoromethyl, pentafluoroethyl, heptafluoropropyl, nonafluorobutyl etc. In the general formula [5], R$^8$ and R$^{10}$ may be different from each other.

In the general formula [5], f and g are preferably 0 so as to readily maintain water repellency during the after-mentioned cleaning process after the formation of the protective film The combination of two CH$_3$ groups and one linear alkyl group is preferable as R$^8$ and R$^{10}$ in the general formula [5] so as to facilitate uniform formation of the protective film.

Specific examples of the silylation agent compound of the general formula [6] include monomethylsilyl imidazole, monoethylsilyl imidazole, monopropylsilyl imidazole, monobutylsilyl imidazole, dimethylsilyl imidazole, trimethylsilyl imidazole, ethyl dimethylsilyl imidazole, propyl dimethylsilyl imidazole, butyl dimethylsilyl imidazole, monomethylsilyl triazole, monoethylsilyl triazole, monopropylsilyl triazole, monobutylsilyl triazole, dimethylsilyl triazole, trimethylsilyl triazole, ethyl dimethylsilyl triazole, propyl dimethylsilyl triazole, butyl dimethylsilyl triazole, those obtained by replacing imidazole structures of the aforementioned imidazole compounds with a benzoimidazole structure, and those obtained by replacing triazole structures of the aforementioned triazole compounds with a benzotriazole structure.

In the general formula [6], j is preferably 0 so as to readily maintain water repellency during the after-mentioned cleaning process after the formation of the protective film.

The combination of two CH$_3$ groups and one linear alkyl group is preferable as R$^{11}$ so as to facilitate uniform formation of the protective film.

The water-repellent protective film-forming liquid chemical according to the present invention may contain a plurality of kinds selected from the above-mentioned silylation agents, or may further contain any silylation agent other than the compounds of the above-indicated general formulas [3] to [6]. For example, the liquid chemical may preferably contain as the silylation agent at least one kind selected from the group consisting of compounds the above-indicated general formulas [3] to [6] and at least one kind selected from the group consisting of compounds of the above-indicated general formula [7] for better water repellency imparting effect.

Specific examples of the silylation agent compound of the general formula [7] include [(CH$_3$)$_3$Si]$_2$NH, [(CH$_3$)$_2$Si(H)]$_2$NH, [C$_2$H$_5$Si(CH$_3$)$_2$]$_2$NH, [(C$_2$H$_5$)$_2$Si(CH$_3$)]$_2$NH, [(C$_2$H$_5$)$_3$Si]$_2$NH, [C$_3$H$_7$Si(CH$_3$)$_2$]$_2$NH, [(C$_3$H$_7$)$_2$Si(CH$_3$)]2NH, [(C$_3$H$_7$)$_3$Si]$_2$NH, [C$_4$H$_9$(CH$_3$)$_2$Si]$_2$NH, [C$_5$H$_{11}$(CH$_3$)$_2$Si]$_2$NH, [C$_6$H$_{13}$(CH$_3$)$_2$Si]$_2$NH, [C$_7$H$_{15}$(CH$_3$)$_2$Si]$_2$NH, [C$_8$H$_{17}$(CH$_3$)$_2$Si]$_2$NH, [C$_9$H$_{19}$(CH$_3$)$_2$Si]$_2$NH, [C$_{10}$H$_{21}$(CH$_3$)$_2$Si]$_2$NH, [C$_{11}$H$_{23}$(CH$_3$)$_2$Si]$_2$NH, [C$_{12}$H$_{25}$(CH$_3$)$_2$Si]$_2$NH, [C$_{13}$H$_{27}$(CH$_3$)$_2$Si]$_2$NH, [C$_{14}$H$_{29}$(CH$_3$)$_2$Si]$_2$NH, [C$_{15}$H$_{31}$(CH$_3$)$_2$Si]$_2$NH, [C$_{16}$H$_{33}$(CH$_3$)$_2$Si]$_2$NH, [C$_{17}$H$_{35}$(CH$_3$)$_2$Si]$_2$NH, [C$_{18}$H$_{37}$(CH$_3$)$_2$Si]$_2$NH, [CF$_3$C$_2$H$_4$(CH$_3$)$_2$Si]$_2$NH, [C$_2$F$_5$C$_2$H$_4$(CH$_3$)$_2$Si]$_2$NH, [C$_3$F$_7$C$_2$H$_4$(CH$_3$)$_2$Si]$_2$NH, [C$_4$F$_9$C$_2$H$_4$(CH$_3$)$_2$Si]$_2$NH, [C$_5$F$_{11}$C$_2$H$_4$(CH$_3$)$_2$Si]$_2$NH, [C$_6$F$_{13}$C$_2$H$_4$(CH$_3$)$_2$Si]$_2$NH, [C$_7$F$_{15}$C$_2$H$_4$(CH$_3$)$_2$Si]$_2$NH, [C$_8$F$_{17}$C$_2$H$_4$(CH$_3$)$_2$Si]$_2$NH, [C$_3$H$_7$(C$_2$H$_5$)$_2$Si]$_2$NH, [C$_4$H$_9$(C$_2$H$_5$)$_2$Si]$_2$NH, [C$_5$H$_{11}$(C$_2$H$_5$)$_2$Si]$_2$NH, [C$_6$H$_{13}$(C$_2$H$_5$)$_2$Si]$_2$NH, [C$_7$H$_{15}$(C$_2$H$_5$)$_2$Si]$_2$NH, [C$_8$H$_{17}$(C$_2$H$_5$)$_2$Si]$_2$NH, [C$_9$H$_{19}$(C$_2$H$_5$)$_2$Si]$_2$NH, [C$_{10}$H$_{21}$(C$_2$H$_5$)$_2$Si]$_2$NH, [C$_{11}$H$_{23}$(C$_2$H$_5$)$_2$Si]$_2$NH, [C$_{12}$H$_{25}$(C$_2$H$_5$)$_2$Si]$_2$NH, [C$_{13}$H$_{27}$(C$_2$H$_5$)$_2$Si]$_2$NH, [C$_{14}$H$_{29}$(C$_2$H$_5$)$_2$Si]$_2$NH, [C$_{15}$H$_{31}$(C$_2$H$_5$)$_2$Si]$_2$NH, [C$_{16}$H$_{33}$(C$_2$H$_5$)$_2$Si]$_2$NH, [C$_{17}$H$_{35}$(C$_2$H$_5$)$_2$Si]$_2$NH and [C$_{18}$H$_{37}$(C$_2$H$_5$)$_2$Si]$_2$NH.

In the general formula [7], l is preferably 0 so as to readily maintain water repellency during the after-mentioned cleaning process after the formation of the protective film. Further, the combination of two CH$_3$ groups and one linear alkyl group is preferable as R$^{12}$ so as to facilitate uniform formation of the protective film.

Component (II): Nitrogen-Containing Compound

With the use of at least one kind of nitrogen-containing compound selected from the group consisting of those of the following general formulas [1] and [2], the reactivity between the silylation agent and the silicon element-containing wafer surface is greatly improved so as to form the protective film in a short time.

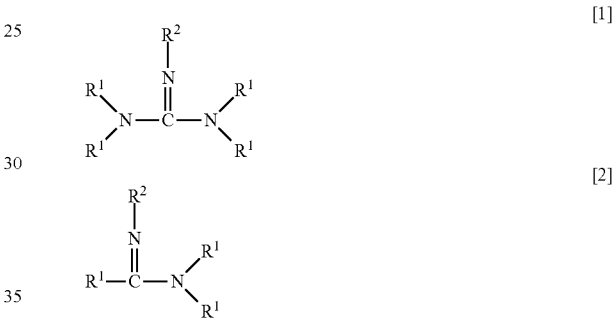

In the general formulas [1] and [2], R$^1$ is each independently a hydrogen atom, a —C≡N group, a —NO$_2$ group, or a hydrocarbon group in which a part or all of hydrogen atoms may be substituted with a fluorine atom; the hydrocarbon group as R$^1$ may contain an oxygen atom and/or a nitrogen atom and, when containing a nitrogen atom, has an acyclic structure; R$^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as R$^2$ may contain an oxygen atom and/or a nitrogen atom and, when containing a nitrogen atom, has an acyclic structure.

The hydrocarbon group may have a linear or branched structure as exemplified by methyl, ethyl, propyl, butyl etc. or may have a cyclic structure as exemplified by cyclopropyl, cyclobutyl, cyclopentyl, cyclohexyl etc.

The hydrocarbon group may contain an oxygen atom. In this case, the hydrocarbon group can be exemplified by linear, branched or cyclic alkoxy groups such as methoxy, ethoxy, propoxy and butoxy. The oxygen atom may be present in the form of an ether bond between carbon atoms of the hydrocarbon group.

The hydrocarbon group may contain a nitrogen atom. In this case, the hydrocarbon group can be exemplified by those containing primary to tertiary amino substituents.

As the component (II), the nitrogen-containing compound is provided with varying degrees of basicity by changing the kinds of R$^1$ and R$^2$. In the case of selecting electron-donating group as R$^1$ and R$^2$ in the general formulas [1] and [2], for example, the electron density in the vicinity of a nitrogen atom that forms a double bond with a carbon atom increases to increase the basicity of the entire compound. The basicity of the component (II) can be set according to the water repellency imparting effect required for the pattern to which the liquid chemical is applied and the compatibility of the liquid chemical with the film kind of the wafer surface.

In terms of the water repellency imparting effect, it is preferable that $R^1$ and $R^2$ are electron-donating groups. Among others, $R^1$ is preferably selected from a hydrogen atom, an alkyl group of 1 to 6 carbon atoms and an alkoxy group of 1 to 6 carbon atoms. Specific examples of the alkyl group of 1 to 6 carbon atoms include methyl, ethyl, n-propyl, isopropyl, cyclopropyl, n-butyl, isobutyl, sec-butyl, tert-butyl, cyclobutyl, n-pentyl, cyclopentyl, n-hexyl and cyclohexyl. Specific examples of the alkoxy group of 1 to 6 carbon atoms include methoxy, ethoxy, n-propyloxy, isopropyloxy, n-butyloxy, isobutyloxy, sec-butyloxy, tert-butyloxy, n-pentyloxy and n-hexyloxy. Further, $R^2$ is preferably selected from a hydrogen atom, an alkyl group of 1 to 6 carbon atoms and an alkylsilyl group of the following general formula [8].

—[Si($R^{13}$)$_m$(H)$_n$]  [8]

In the above formula, $R^3$ is each independently a monovalent hydrocarbon group of 1 to 18 carbon atoms; m and n are each an integer of 0 to 3; and the sum of m and n is 3.

Among the compounds of the general formula [1], relatively easily available are guanidine (solid at 25° C. and 1.0 atmospheric pressure), 1,1,3,3-tetramethylguanidine (liquid at 25° C. and 1.0 atmospheric pressure), 2-tert-butyl-1,1,3,3-tetramethylguanidine (liquid at 25° C. and 1.0 atmospheric pressure), 1,3-diphenylguanidine (solid at 25° C. and 1.0 atmospheric pressure), 1,2,3-triphenylguanidine (solid at 25° C. and 1.0 atmospheric pressure) and the like.

Examples of the compound of the general formula [2] include 2-carbamoyl acetoamidine (liquid at 25° C. and 1.0 atmospheric pressure), 2-amino-2-carbamoyl acetoamidine (liquid at 25° C. and 1.0 atmospheric pressure), 2-amino acetoamidine (liquid at 25° C. and 1.0 atmospheric pressure), acetoamidine (liquid at 25° C. and 1.0 atmospheric pressure), N,N'-diphenylformamidine (solid at 25° C. and 1.0 atmospheric pressure), 2,2,3,3,3-pentafluoropropylamidine (solid at 25° C. and 1.0 atmospheric pressure) and the like. Among others, relatively easily available are N,N'-diphenylformamidine and 2,2,3,3,3-pentafluoropropylamidine.

For good water repellency imparting effect, the component (II) preferably contains at least one kind of nitrogen-containing compound selected from the group consisting of those of the general formula [1].

The component (II) serves as a catalyst component to promote reaction of the silylation agent with the silicon element-containing wafer surface. This component may form a part of the water-repellent protective film. The silicon-free nitrogen-containing compound described as the catalyst component in Patent Document 1 presents the problem that: it often takes a long time to dissolve the silicon-free nitrogen-containing compound together with the sililation agent in a solvent; or it may not be possible to obtain a sufficient water repellency imparting effect. It is thus preferable that the component (II) is liquid at 25° C. and 1.0 atmospheric pressure in terms of the raw material dissolution time and in terms of the water repellency imparting effect. Among the compounds of the general formula [1], particularly preferred are those liquid at 25° C. and 1.0 atmospheric pressure. Specific examples of such preferable compounds includes 1,1,3,3-tetramethylguanidine, 2-tert-butyl-1,1,3,3-tetramethylguanidine and 2-trimethylsilyl-1,1,3,3-tetramethylguanidine.

Component (III): Organic Solvent

There is no particular limitation on the kind of the organic solvent used as long as the organic solvent is capable of dissolving therein the components (I) and (II).

Preferably, the concentration of the component (I) is 1 to 50 mass % based on 100 mass % of the total amount of the components (I) to (III) so as to facilitate uniform formation of the protective film on the silicon element-containing wafer surface. When the concentration of the component (I) is lower than 1 mass %, the water repellency imparting effect of the liquid chemical tends to be insufficient. In terms of the cost, it is unfavorable that the concentration of the component (I) exceeds 50 mass %. The concentration of the component (I) is more preferably 1 to 30 mass %, still more preferably 1 to 20 mass %.

Further, the concentration of the component (II) is preferably 0.01 to 30 mass % based on 100 mass % of the total amount of the components (I) to (III) so as to facilitate uniform formation of the protective film on the silicon element-containing wafer surface. When the concentration of the component (II) is lower than 0.01 mass %, the water repellency imparting effect of the liquid chemical tends to be small. It is unfavorable that the concentration of the component (II) exceeds 30 mass % in view of the possibility that the component (I may remain as an impurity on the wafer as well as in terms of the ease of preparation of the water-repellent protective film-forming liquid chemical due to the fact that the viscosity of the liquid chemical increases with increase in the concentration of the component (II). The concentration of the component (II) is more preferably 0.05 to 20 mass %, still more preferably 0.1 to 10 mass %.

As the organic solvent component (III), suitably usable are aprotic solvents such as hydrocarbons, esters, ethers, ketones, halogen-containing solvents, sulfoxide solvents, lactone solvents, carbonate solvents, OH-free polyol derivatives, NH-free nitrogen-containing solvents, silicone solvents etc. or a mixture thereof. Among others, the organic solvent is preferably selected from hydrocarbons, esters, ethers, halogen-containing solvents, OH-free polyol derivatives and any mixture thereof so as to form the water-repellent protective film on the silicon element-containing wafer surface in a short time.

Examples of the hydrocarbons include hexane, heptane, octane, nonane, decane, dodecane, tetradecane, hexadecane, octadecane, eicosane, cyclohexane, methylcyclohexane, decalin, benzene, toluene, xylene and diethylbenzene.

Examples of the esters include ethyl acetate, propyl acetate, butyl acetate and ethyl acetoacetate.

Examples of the ethers include diethyl ether, dipropyl ether, ethyl butyl ether, dibutyl ether, ethyl amyl ether, diamyl ether, methyl cyclopentyl ether, ethyl hexyl ether, dihexyl ether, dioctyl ether, diphenyl ether, tetrahydrofuran, dioxane, methyl perfluoropropyl ether, methyl perfluorobutyl ether, ethyl perfluorobutyl ether, methyl perfluorohexyl ether and ethyl perfluorohexyl ether.

Examples of the ketones include acetone, acetylacetone, methyl ethyl ketone, methyl propyl ketone, methyl butyl ketone, cyclohexanone and isophorone.

Examples of the halogen-containing solvents include: perfluorocarbons such as perfluorooctane, perfluorononane, perfluorocyclopentane, perfluorocyclohexane and hexafluorobenzene; hydrofluorocarbons such as 1,1,1,3,3-pentafluorobutane, octafluorocyclopentane, 2,3-dihydrodecafluoropentane and Zeorora H (available from Zeon Corporation);

hydrofluoroethers such as methyl perfluoroisobutyl ether, methyl perfluorobutyl ether, ethyl perfluorobutyl ether, ethyl perfluoroisobutyl ether, Asahiklin AE-3000 (available from Asahi Glass Co., Ltd.), Novec 7100, Novec 7200, Novec 7300 and Novec 7600 (each available from 3M Company); chlorocarbons such as tetrachloromethane; hydrochlorocarbons such as chloroform; chlorofluorocarbons such as dichlorodifluoromethane; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene and 1,2-dichloro-3,3,3-trifluoropropene; perfluoroethers; and perfluoropolyethers.

Examples of the sulfoxide solvents include dimethyl sulfoxide.

Example of the lactone solvents include γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone and ε-hexanolactone.

Examples of the carbonate solvents include dimethyl carbonate, ethyl methyl carbonate, diethyl carbonate and propylene carbonate.

Examples of the OH-free polyol derivatives include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate and glycerin triacetate.

Examples of the NH-free nitrogen-containing solvents include N,N-dimethylformamide, N,N-dimethylacetamide, N-methyl-2-pyrrolidone, triethylamine and pyridine.

Among the above organic solvents, at least one kind of organic solvent selected from the group consisting of the hydrocarbons, esters, sulfoxide solvents and OH-free polyalcohol derivatives is preferred in terms of the solubility of the components (I) and (II). It is preferable to contain such a preferred organic solvent in an amount of 50 to 100 mass % based on 100 mass % of the total amount of the component (III).

The water-repellent protective film-forming liquid chemical according to the present invention can be used by storing the raw materials in two or more separate states and mixing the raw materials together before the use. For example, it is feasible to mix a solution of the components (I) and (III) and a solution of the components (II) and (III) with each other before the use, mix the component (I) with a solution of the components (II) and (III) before the use, or mix a solution of the components (I) and (III) with the component (II) before the use.

Cleanliness of Liquid Chemical (Raw Materials)

It is preferable that the total amount of water contained in the components (I) to (III) before the preparation of the liquid chemical is 5000 mass ppm or less based on the total amount of the components (I) to (III). When the total amount of water exceeds 5000 mass ppm, the water repellency imparting effect of the liquid chemical tends to be lowered. For this reason, it is preferable that the total amount of water is as small as possible. The total amount of water is more preferably 500 mass ppm or less, still more preferably 200 mass ppm or less. Due to the fact that the larger the amount of water present, the more likely the storage stability of the liquid chemical is to be deteriorated, it is preferable that the total amount of water is small. Thus, the total amount of water is particularly preferably 100 mass ppm or less, more particularly preferably 50 mass ppm or less. Although it is preferable that the total amount of water is as small as possible, the total amount of water may be 0.1 mass ppm or more as long as within the above range. Consequently, it is preferable that the components (I) to (III) before the preparation of the liquid chemical are low in water content.

It is also preferable that, in a particle measurement made in a liquid phase of the liquid chemical by a light scattering type in-liquid particle detector, the number of particles of diameter larger than 0.2 μm is 100 or less per 1 mL of the liquid chemical. When the number of particles of diameter larger than 0.2 μm exceeds 100 per 1 mL of the liquid chemical, there unfavorably occurs a risk that the particles cause damage to the pattern on the silicon element-containing wafer. This pattern damage can lead to a deterioration in device yield and reliability. When the number of particles of diameter larger than 0.2 μm is 100 or less per 1 mL of the liquid chemical, it is favorably possible to omit or reduce the cleaning of the wafer with a solvent or water after the formation of the protective film. Although it is preferable that the number of particles of diameter larger than 0.2 μm in the liquid chemical is as less as possible, the number of particles of diameter larger than 0.2 μm may be 1 or more per 1 mL of the liquid chemical as long as within the above range. In the present invention, the particle measurement in the liquid phase of the liquid chemical can be made by a commercially available measurement device on the basis of a laser light scattering type in-liquid particle measuring method using a laser as a light source. The particle diameter means a light scattering equivalent diameter with reference to a PSL (polystyrene latex) standard particle.

Herein, the term "particles" include not only particles such as dust, dirt, organic solid matter and inorganic solid matter contained as impurities in the raw materials but also particles such as dust, dirt, organic solid matter and inorganic solid matter introduced as contaminants during preparation of the liquid chemical, and refer to particles finally present without being dissolved in the liquid chemical.

Furthermore, it is preferable that the amount of respective Na, Mg, K, Ca, Mn, Fe, Cu, Li, Al, Cr, Ni, Zn and Ag elements (as metal impurity elements) in the liquid chemical is 0.1 mass ppb or less based on the total amount of the liquid chemical. When the amount of the metal impurity elements in the liquid chemical exceeds 0.1 mass ppb based on the total amount of the liquid chemical, there unfavorably occurs a risk of increase in device junction leakage current. This leakage current increase can lead to a deterioration in device yield and reliability. When the amount of the metal impurity elements in the liquid chemical is 0.1 mass ppb or less based on the total amount of the liquid chemical, it is favorably possible to omit or reduce the cleaning of the wafer surface (that is, the surface of the protective film) with a solvent or water after the formation of the protective film on the wafer surface. For this reason, it is preferable that the amount of the metal impurity elements in the liquid chemical is as small as possible. The amount of each of the metal impurity elements in the liquid chemical may however be 0.001 mass ppb or more as long as within the above range.

2. Water-Repellent Protective Film

In the present invention, the water-repellent protective film refers to a film formed on a wafer surface to decrease the wettability of the wafer surface, that is, impart water repellency to the wafer surface. The term "water repellency" as used herein means decreasing a surface energy of an article surface and thereby reducing an interaction such as hydrogen bond or intermolecular force (at an interface) between water or another liquid and the article surface. The water repellency provides a great interaction reducing effect against water, and provides a certain interaction reducing effect against a mixed liquid of water and a liquid other than water or against a liquid other than water. The contact angle of a liquid with an article surface can be increased with reduction of the interaction between the liquid and the article surface. Herein, the water-repellent protective film may be formed of the silylation agent or may include a reaction product containing the silylation agent as a predominant component.

3. Wafer

Examples of the wafer include those each having formed on a surface thereof a film which contains a silicon element in the form of silicon, silicon oxide, silicon nitride etc. and those in which, when an uneven pattern is formed, at least a part of the uneven pattern contains a silicon element in the form of silicon, silicon oxide, silicon nitride etc. Even in the case of using a wafer composed of multiple components containing at least a silicon element, the protective film is applicable to a surface of the silicon element-containing component. Examples of such a multiple-component wafer include those each having a surface on which a silicon element-containing component such as silicon, silicon oxide, silicon nitride etc. is provided and those in which, when an uneven pattern is formed, at least a part of the uneven pattern contains a silicon element-containing component such as silicon, silicon oxide, silicon nitride etc. It is herein noted that the area of the wafer where the protective film can be formed from the liquid chemical is a surface of the silicon element-containing part of the wafer.

In general, a wafer having a fine uneven pattern on a surface thereof is obtained by the following procedure. First, a resist is applied to a smooth surface of the wafer. Next, the applied resist is exposed to light through a resist mask. Exposed portions or unexposed portions of the resist are removed by etching, thereby forming the resist with a desired uneven pattern. The resist with the uneven pattern may alternatively be formed by pressing a mold with a pattern against the resist. Then, the wafer is subjected to etching. In this etching step, portions of the wafer surface corresponding to the recess portions of the resist pattern is selectively etched. Finally, the resist is removed. As a result, there is obtained the wafer with the fine uneven pattern.

Figure 2:
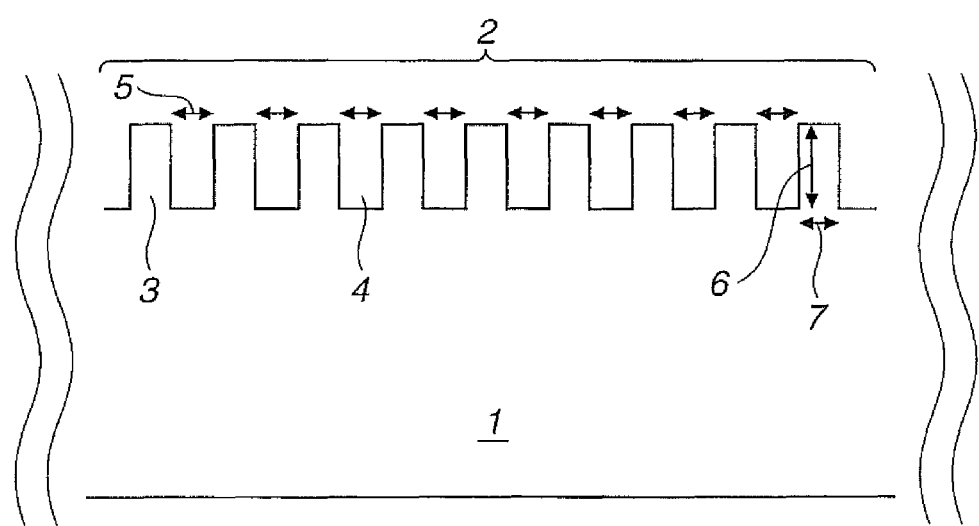
FIG. 2 is a view showing a part of a-a' cross section of FIG. 1.

After the formation of the fine uneven pattern on the wafer surface, the wafer surface is cleaned with a water-based cleaning liquid; and the water-based cleaning liquid is removed from the wafer surface by drying or the like. During such cleaning process, a pattern collapse is likely to occur in the pattern when the width of recess portions of the pattern is small and the aspect ratio of projection portions of the pattern is high. The dimensions of the uneven pattern are defined as shown in FIGS. 1 and 2. FIG. 1 is a schematic perspective view of a wafer 1 having on a surface thereof a fine uneven pattern 2. FIG. 2 is a view showing a part of a-a' cross section of FIG. 1. As shown in FIG. 2, a width 5 of the recess portions is determined as an interval between adjacent projection portions 3; and an aspect ratio of the projection portions is determined by dividing a height 6 of the projection portions by a width 7 of the projection portions. The pattern collapse tends to occur during the cleaning process when the width of the recess portions is 70 nm or smaller, particularly 45 nm or smaller, and the aspect ratio of the projection portions is 4 or higher, particularly 6 or higher.

4. Surface Treatment of Wafer

The wafer, on which the fine uneven pattern has been formed by etching as mentioned above, may be cleaned with a water-based cleaning liquid so as to remove etching residues in advance of the surface treatment of the wafer with the liquid chemical according to the present invention. The wafer may be further cleaned by replacing the water-based cleaning liquid remaining in the recess portions after the above cleaning process with a cleaning liquid different from the water-based cleaning liquid (hereinafter referred to as "cleaning liquid A").

As the water-based cleaning liquid, there can be used water or an aqueous solution containing in water at least one kind selected from organic solvent, hydrogen peroxide, ozone, acid, alkali and surfactant (e.g. with a water content of 10 mass % or more).

As the cleaning liquid A, there can be used an organic solvent, a mixture of an organic solvent and a water-based cleaning liquid, or a cleaning liquid containing at least one kind selected from acid, alkali and surfactant in the organic solvent or in the mixture of the organic solvent and the water-based cleaning liquid.

In the present invention, there is no particular limitation on the technique for treatment of the wafer as long as the treatment is performed with the use of a cleaning machine by which the liquid chemical or the cleaning liquid is retained in liquid form in at least the recess portions of the uneven pattern of the wafer. As the wafer treatment technique, it is feasible to adopt a single wafer process such as a treatment process using a spin cleaning machine in which wafers are cleaned one by one by rotating the wafer in a nearly horizontal position while supplying the liquid to the vicinity of the rotation center, or a batch process using a cleaning machine in which a plurality of wafers are cleaned together by immersing the wafers in the liquid within a chamber. There is no particular limitation on the form of the protective film-forming liquid chemical or the cleaning liquid supplied to at least the recess portions of the uneven pattern of the wafer as long as the protective film-forming liquid chemical or the cleaning liquid is in a liquid state when retained in the recess portions. The protective film-forming liquid chemical or the cleaning liquid can be supplied in e.g. liquid form or vapor form.

Examples of the organic solvent preferably usable as the cleaning liquid A include hydrocarbons, esters, ethers, ketones, halogen-containing solvents, sulfoxide-based solvents, lactone-based solvents, carbonate-based solvents, alcohols, polyol derivatives, nitrogen-containing solvents and the like.

The protective film-forming liquid chemical according to the present invention is used by replacing the water-based cleaning liquid or cleaning liquid A with the liquid chemical. The replaced liquid chemical may be further replaced with a cleaning liquid different from the liquid chemical (hereinafter referred to as "cleaning liquid B").

After the cleaning of the wafer with the water-based cleaning liquid or cleaning liquid A, the cleaning liquid is replaced with the protective film-forming liquid chemical as mentioned above. While the liquid chemical is retained in at least the recess portions of the uneven pattern, the protective film is formed on at least the surface of the recess portions of the uneven pattern. In the present invention, the protective film is not necessarily continuously formed and is not necessarily uniformly formed. It is however preferable that the protective film is continuously and uniformly formed to impart higher water repellency.

Figure 3:
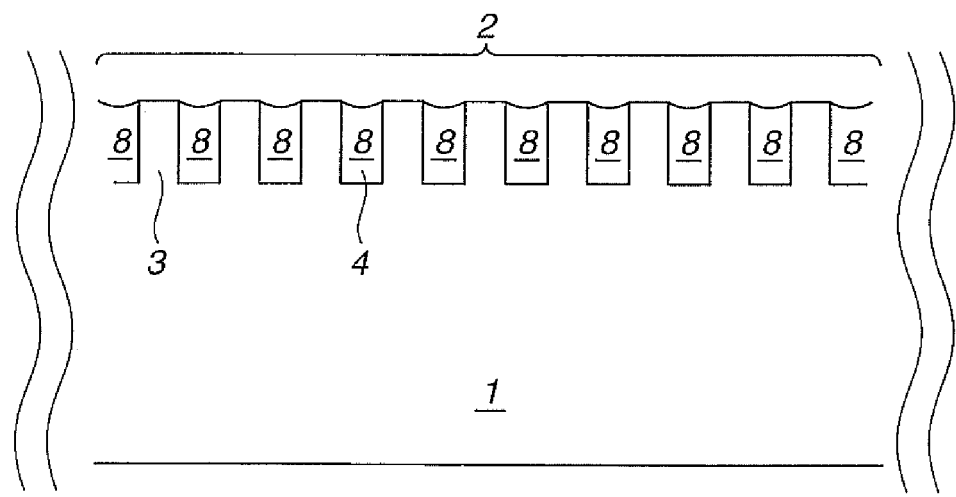
FIG. 3 is a schematic view showing a state where a water-repellent protective film-forming liquid chemical 8 is retained in recess portions 4 of the pattern during cleaning process.

FIG. 3 is a schematic view showing a state where the protective film-forming liquid chemical 8 is retained in the recess portions 4. The schematic view of FIG. 3 corresponds to a part of the a-a' cross section of FIG. 1. In this state, the protective film is formed on the surface of the recess portions 4 so that the surface of the recess portions 4 is made water repellent.

As the temperature of the protective film-forming liquid chemical is increased, it becomes easy to form the protective film in a shorter time. The temperature at which the uniform protective film can be easily formed from the liquid chemical is higher than or equal to 10° C. and lower than a boiling point of the liquid chemical. In particular, the liquid chemical is preferably retained at a temperature higher than or equal to 15° C. and lower than or equal to a temperature 10° C. lower than the boiling point of the liquid chemical. It is preferable to maintain the temperature of the liquid chemical at the above-mentioned temperature even while the liquid chemical is retained in at least the recess portions of the uneven pattern. Herein, the boiling point of the protective film-forming liquid chemical means a boiling point of any component present in the largest amount by mass ratio among the components of the liquid chemical.

After the formation of the protective film, the protective film may be subjected to drying subsequent to the replacement of the protective film-forming liquid chemical remaining in at least the recess portions of the uneven pattern with the cleaning liquid B. As the cleaning liquid B, there can be used a water-based cleaning liquid, an organic solvent, a mixture of a water-based cleaning liquid and an organic solvent with or without at least one kind selected from acid, alkali and surfactant, or a mixture thereof with the protective film-forming liquid chemical. In terms of the removal of particles and metal impurities, the cleaning liquid B is preferably water, an organic solvent or a mixture of an organic solvent and water.

Examples of the organic solvent preferably usable as the cleaning liquid B include hydrocarbons, esters, ethers, ketones, halogen-containing solvents, sulfoxide-based solvents, alcohols, polyol derivatives, nitrogen-containing solvents and the like.

There are cases where, when the organic solvent is used as the cleaning liquid B, the protective film formed on the wafer surface from the liquid chemical according to the present invention is less likely to be deteriorated in water repellency by cleaning with the cleaning liquid B.

Figure 4:
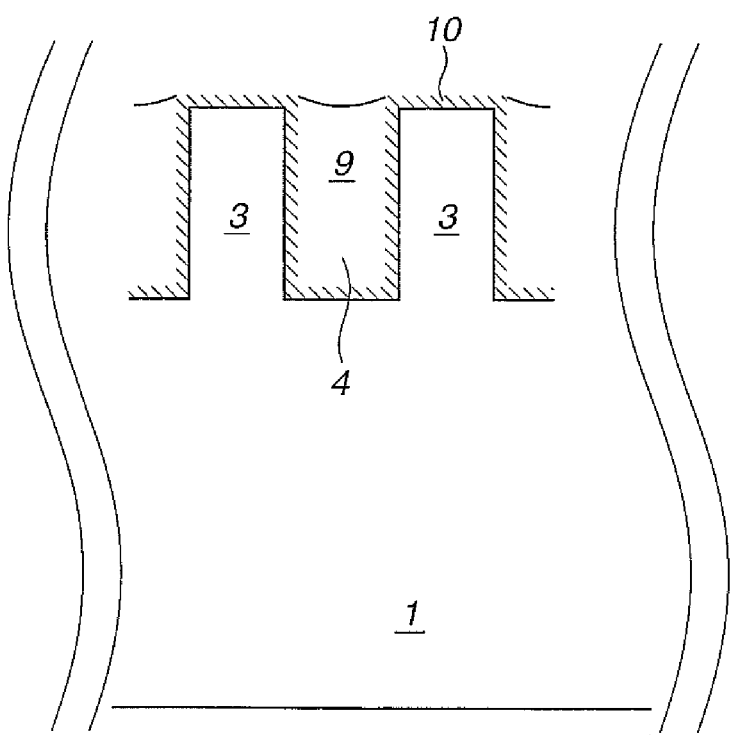
FIG. 4 is a schematic view showing a state where a liquid is retained in recess portions 4 of the pattern on which a protective film has been formed.

FIG. 4 is a schematic view showing a state where a liquid is retained in the recess portions 4 to which water repellency has been imparted by the protective film-forming liquid chemical. The schematic view of FIG. 4 corresponds to a part of a-a' cross section of FIG. 1. The surface of the uneven pattern is made water repellent as the protective film 10 has been formed from the liquid chemical on the surface of the uneven pattern. Even when the liquid 9 is removed from the uneven pattern, the protective film 10 is maintained on the wafer surface.

It is herein assumed that, in a state where the protective film 10 has been formed from the protective film-forming liquid chemical on at least the surface of the recess portions of the uneven pattern of the wafer, water is retained on the surface of the recess portions. In this state, the contact angle of the water to the surface is preferably 50 to 130° so that a pattern collapse is made less likely to occur. The larger the contact angle, the higher the water repellency. Thus, the contact angle is more preferably 60 to 130°, still more preferably 65 to 130°. In addition, it is preferable that a decrease of the contact angle before and after the cleaning with the cleaning liquid B (i.e. the contact angle before the cleaning with the cleaning liquid B—the contact angle after the cleaning with the cleaning liquid B) is 10° or less.

The liquid retained in the recess portions 4 on which the protective film 10 has been formed from the liquid chemical is removed by drying. The liquid retained in the recess portions may be the liquid chemical, the cleaning liquid B or a mixed liquid thereof. The mixed liquid is a composition in which the components (I) and (II) are contained at lower concentrations than in the liquid chemical. Accordingly, the mixed liquid may be a liquid formed in the middle of replacing the liquid chemical with the cleaning liquid B or may be a liquid prepared in advance by mixing the components (I) and (II) into the cleaning liquid B. In terms of the cleanliness of the wafer, water, the organic solvent or a mixture thereof is preferred. After the liquid is once removed from the surface of the uneven pattern, the cleaning liquid B may be retained on the surface of the uneven pattern and then removed by drying.

In the case of cleaning the wafer with the cleaning liquid B after the formation of the protective film, the cleaning time, that is, the time of retaining the cleaning liquid B is preferably 10 seconds or longer, more preferably 20 seconds or longer, in terms of the removal of the particles or impurities from the surface of the uneven pattern. From the viewpoint of the water repellency maintaining effect of the protective film on the surface of the uneven pattern, there is a tendency that the water repellency of the wafer surface can be easily maintained even after the cleaning when the organic solvent is used as the cleaning liquid B. On the other hand, the productivity of the wafer is deteriorated when the cleaning time is too long. The cleaning time is thus preferably 15 minutes or shorter.

By the drying, the liquid retained in the uneven pattern is removed. It is preferable to perform the drying by a known drying process such as spin drying, IPA (2-propanol) steam drying, Marangoni drying, heat drying, hot-air drying, air-blow drying or vacuum drying.

The protective film 10 may be removed after the drying. For removal of the water-repellent protective film, it is effective to cleave C—C bond and C—F bond in the water-repellent protective film. There is no particular limitation on the bond cleavage technique as long as it is capable of cleaving the above-mentioned bond. For example, it is feasible to treat the wafer surface by light irradiation, heating, ozone exposure, plasma irradiation, corona discharge or the like.

In the case of removing the protective film 10 by light irradiation, it is preferable to irradiate the protective film with ultraviolet light of wavelengths shorter than 340 nm and 240 nm, which respectively correspond to 83 kcal/mol and 116 kcal/mol, i.e., the bond energies of C—C bond and C—F bond in the protective film 10. As a light source, there can be used a metal halide lamp, a low-pressure mercury lamp, a high-pressure mercury lamp, an excimer lamp, a carbon arc lamp or the like. In the case of using a metal halide lamp, the irradiation intensity of the ultraviolet light is preferably 100 mW/cm$^2$ or higher, more preferably 200 mW/cm$^2$ or higher, as measured by an illuminometer (such as an irradiation intensity meter UM-10 manufactured by Konica Minolta Sensing, Inc. with a light receptor UM-360 (peak sensitivity wavelength: 365 nm, measurement wavelength range: 310 to 400 nm)). When the irradiation intensity is lower than 100 mW/cm$^2$, it takes a long time to remove the protective film 10. It is preferable to use the low-pressure mercury lamp because the low-pressure mercury lamp emits ultraviolet light of shorter wavelengths so as to, even if the irradiation intensity is low, remove the protective film 10 in a short time.

In the case of removing the protective film 10 by light irradiation, it is preferable to generate ozone in parallel with decomposing the constituent components of the protective film 10 by irradiation with ultraviolet light and then induce oxidation volatilization of the constituent components of the protective film 10 by the ozone for shortening of the treatment time. In this case, there can be used a low-pressure mercury lamp, an excimer lamp etc. as a light source. The wafer may be heated while being subjected to light irradiation.

In the case of heating the wafer, the heating temperature of the wafer is preferably 400 to 1000° C., more preferably 500 to 900° C.; and the heating time of the wafer is preferably 10 seconds to 60 minutes, more preferably 30 seconds to 10 minutes. The heating may be done in combination with ozone exposure, plasma irradiation, corona discharge or the like. The wafer may be subjected to light irradiation while heating.

As the technique of removing the protective film 10 by heating, it is feasible to bring the wafer into contact with a heat source or to place the wafer in a heated atmosphere such as heat treatment furnace. The placement of the wafer in the heated atmosphere is industrially advantageous in terms of easy treatment operation, short treatment time and high treatment capability because, even in the case of treating a plurality of wafers, the energy for removal of the protective film 10 can be applied uniformly to the respective wafer surfaces by the placement of the wafers in the heated atmosphere.

In the case of exposing the wafer to ozone, it is preferable to supply the wafer surface with ozone generated by ultraviolet radiation from a low-pressure mercury lamp etc., low-temperature discharge under high voltage application, or the like. The wafer may be subjected to light irradiation or heating while being exposed to ozone.

The protective film on the wafer surface can be efficiently removed by any combination of the light irradiation treatment, the heating treatment, the ozone exposure treatment, the plasma irradiation treatment and the corona discharge treatment.

EXAMPLES

The present invention will be described in more detail below by way of the following embodiment examples. It should however be understood that the present invention is not limited to the following embodiment examples.

A method of forming an uneven pattern on a surface of a wafer and a method of replacing a cleaning liquid retained in at least recess portions of the uneven pattern with another cleaning liquid have been variously studied as discussed in other literatures and have already been established. Accordingly, evaluations were made about the water repellency imparting effect of the protective film-forming liquid chemical in the present invention. In the following examples, water, which is known as a typical water-based cleaning liquid, was used as a liquid brought into contact with a surface of a wafer for contact angle evaluations.

In the case of a wafer having a fine uneven pattern on a surface thereof, however, it is not possible to exactly evaluate the contact angle of water to a protective film 10 itself formed on the uneven pattern.

The contact angle of a water drop is generally evaluated by dropping several microliters of water on a surface of a sample (substrate) and measuring an angle between the water drop and the substrate surface according to JIS R 3257 "Testing Method of Wettability of Glass Substrate Surface". In the case of the wafer having the pattern, the contact angle is enormously large. This is due to the Wenzel's effect or Cassie's effect by which the apparent contact angle of the water drop becomes increased under the influence of the substrate surface shape (roughness) on the contact angle.

In view of the above facts, the embodiment examples were each carried out by providing a wafer with a smooth surface, supplying a liquid chemical to the smooth surface of the wafer to form a protective film on the wafer surface, and then, making various evaluations on the assumption of the thus-formed protective film as a protective film formed on an uneven pattern of a wafer. In each of the embodiment examples, a silicon wafer having a smooth surface coated with a SiO$_2$ layer, called a "SiO$_2$-coated wafer", was used as the wafer with the smooth surface.

Hereinafter, detailed explanations will be given of methods of evaluations, a method of preparing a protective film-forming liquid chemical, a method of surface-treating a wafer with a protective film-forming liquid chemical, and results of evaluations.

Methods of Evaluations (A) Evaluation of Raw Material Dissolution Time During Preparation of Liquid Chemical Raw materials of a protective film-forming liquid chemical were put into a mixing container under an atmosphere of 1.0 atm of nitrogen in a globe box where the ambient temperature was set to 25° C.

While the ambient temperature was maintained at 25° C., the raw materials of the protective film-forming liquid chemical were mixed together. The time of stirring until dissolution of the whole raw materials (as a dissolution time) was measured by visual inspection. As a matter of course, it is preferable that the dissolution time is shorter because the shorter the dissolution, the easier it is to dissolve the raw materials.

In the following tables, the dissolution time was indicated as "○" in the case where the raw materials were dissolved by stirring during a time period more than 5 seconds and less than or equal to 30 seconds. In the case where the raw materials were dissolved by stirring within 5 seconds, the dissolution time was indicated as "⊙" upon judging that the solubility was very high. On the other hand, the dissolution time was indicated as "Δ" in the case where, even though the raw materials were dissolved with continuation of stirring, it took more than 30 seconds to dissolve the raw materials. The dissolution time was indicated as "X" in the case where it was impossible to dissolve the whole of the raw materials even by stirring for 1 hour or more.

(B) Evaluation of Contact Angle to Protective Film on Wafer Surface

About 2 μl of pure water was dropped on a surface of a wafer on which a protective film was formed. In this state, the angle between the water drop and the wafer surface (as a contact angle) was measured with a contact angle meter (manufactured by Kyowa Interface Science Co., Ltd.: CA-X Model).

Example 1

(1) Preparation of Protective Film-Forming Liquid Chemical

In a globe box where the ambient temperature was set to 25° C., trimethylsilyl trifluoroacetate (($CH_3$)$_3$SiOC($=$O)$CF_3$; hereinafter referred to as "TMS-TFA") as the component (I), 2-tert-butyl-1,1,3,3-tetramethylguanidine (($CH_3$)$_2$N—C($=$N—C($CH_3$)$_3$)—N($CH_3$)$_2$; hereinafter referred to as "tBu-TMG") as the component (II) and propylene glycol monomethyl ether acetate (hereinafter referred to as "PGMEA") as the organic solvent component (III) were put in a mixing container under an atmosphere of 1.0 atm of nitrogen such that the concentrations of the respective components were set as shown in FIG. 1. These raw materials were mixed together while the ambient temperature was maintained at 25° C. The raw materials were dissolved by stirring within 5 seconds, whereby there was obtained a protective film-forming liquid chemical.

(2) Cleaning of Silicon Wafer

A silicon wafer with a smooth thermal oxide film (more specifically, a silicon wafer having on a surface thereof a thermal oxide film of 1 μm thickness) was immersed in an aqueous solution of 1 mass % hydrogen fluoride at 25° C. for 10 minutes, immersed in pure water at 25° C. for 1 minute and then immersed in 2-propanol (iPA) at 25° C. for 1 minute.

(3) Surface Treatment of Silicon Wafer with Protective Film-Forming Liquid Chemical The above-cleaned silicon wafer was immersed, at 25° C. for 10 minutes, in the protective film-forming liquid chemical that had been prepared in the above section "(1) Preparation of Protective Film-Forming Liquid Chemical". The silicon wafer was further immersed in iPA at 25° C. for 1 minute and immersed in pure water at 25° C. for 1 minute. Finally, the silicon wafer was taken out from the pure water and dried by air blowing to remove the pure water from the surface of the silicon wafer.

The thus-obtained wafer was evaluated. As shown in TABLE 1, the contact angle after the surface treatment was 95°. Accordingly, the liquid chemical had a good water repellency imparting effect.

TABLE 1

| | Composition of Protective Film-Forming Liquid Chemical | | | | | | | | | Evaluation Results | |
|---|---|---|---|---|---|---|---|---|---|---|---|
| | (I)-1 | | | (I)-2 | | | (II) | | | | | |
| | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | | (A) Disso-lution Time | (B) Contact Angle [°] |
| | Kind | [mass %] | [mmol/ 100 g] | Kind | [mass %] | [mmol/ 100 g] | Kind | Form at 25° C. and 1 atm | [mass %] | [mmol/ 100 g] | (III) Organic Solvent | | |
| Ex. 1 | TMS-TFA | 5.6 | 30.2 | none | — | — | tBu-TMG | liquid | 0.4 | 2.4 | PGMEA | ⊙ | 95 |
| Ex. 2 | MSTFA | 6.0 | 30.2 | none | — | — | tBu-TMG | liquid | 0.4 | 2.4 | PGMEA | ⊙ | 84 |
| Ex. 3 | BSTFA | 7.3 | 30.2 | none | — | — | tBu-TMG | liquid | 0.4 | 2.4 | PGMEA | ⊙ | 85 |
| Ex. 4 | TMSIm | 4.2 | 30.2 | none | — | — | tBu-TMG | liquid | 0.4 | 2.4 | PGMEA | ⊙ | 93 |
| Ex. 5 | TMS-TriAz | 4.3 | 30.2 | none | — | — | tBu-TMG | liquid | 0.4 | 2.4 | PGMEA | ⊙ | 94 |
| Ex. 6 | TMS-BzTriAz | 5.8 | 30.2 | none | — | — | tBu-TMG | liquid | 0.4 | 2.4 | PGMEA | ⊙ | 93 |
| Comp. Ex. 1 | TMS-TFA | 5.6 | 30.2 | none | — | — | none | — | — | — | PGMEA | ⊙ | <10 |
| Comp. Ex. 2 | MSTFA | 6.0 | 30.2 | none | — | — | none | — | — | — | PGMEA | ⊙ | 45 |
| Comp. Ex. 3 | BSTFA | 7.8 | 30.2 | none | — | — | none | — | — | — | PGMEA | ⊙ | <10 |
| Comp. Ex. 4 | TMSIm | 4.2 | 30.2 | none | — | — | none | — | — | — | PGMEA | ⊙ | 77 |
| Comp. Ex. 5 | TMS-TriAz | 4.3 | 30.2 | none | — | — | none | — | — | — | PGMEA | ⊙ | 74 |
| Comp. Ex. 6 | TMS-BzTriAz | 5.8 | 30.2 | none | — | — | none | — | — | — | PGMEA | ⊙ | 70 |

Comparative Example 1

A liquid chemical was prepared in the same manner as in Example 1, except that the component (II) was not added to the liquid chemical as shown in TABLE 1. A wafer was surface-treated with the prepared liquid chemical. Then, the surface-treated wafers was evaluated. This Comparative Example 1 was an experimental example using the protective film-forming liquid chemical in which tBu-TMG was not contained. The contact angle after the surface treatment was smaller than 10°. As is apparent from comparison of the contact angle after the surface treatment, the liquid chemical of this Comparative Example was inferior in water repellency imparting effect to that of Example 1.

Examples 2 to 6 and Comparative Examples 2 to 6

In Examples 2 to 6, liquid chemicals were prepared in the same manner as in Example 1, except that the kind and concentration of the silylation agent as the component (I) were changed; wafers were surface-treated with the prepared liquid chemicals, respectively; and the respective surface-treated wafers were evaluated. In Comparative Examples 2 to 6, liquid chemicals were respectively prepared in the same manner as in Examples 2 to 6, except that the component (II) was not added to the liquid chemical; wafers were surface-treated with the prepared liquid chemicals, respectively; and the respective surface-treated wafers were evaluated. The results are shown in TABLE 1. In the table and in the following description, the abbreviation "MSTFA" refers to N-trimethylsilyl-N-methyltrifluoroacetamide $((CH_3)_3Si$—$N$=$C(CF_3)OSi(CH_3)_3)$; the abbreviation "TMSIm" refers to 1-trimethylsilyl imidazole; the abbreviation "TMS-TriAz" refers to 1-(trimethylsilyl)-1,2,4-triazole; and the abbreviation "TMS-BzTriAz" refers to 1-(trimethylsilyl)-1H-benzotriazole.

In each of these Examples, the liquid chemical had a good water repellency imparting effect as the contact angle after the surface treatment was much larger than in the corresponding Comparative Example in which the component (I) was not contained in the liquid chemical.

Examples 7 to 11 and Comparative Examples 7 to 11

In Examples 7 to 11, liquid chemicals were prepared in the same manner as in Example 1, except that two kinds of compounds, i.e., 1,1,3,3-tetramethylguanidine $((CH_3)_2N$—$C(=NH)$—$N(CH_3)_2$; hereinafter referred to as "TMG") and 2-trimethylsilyl-1,1,3,3-tetramethylguanidine $((CH_3)_2N$—$C(=N$—$Si(CH_3)_3)$—$N(CH_3)_2$; hereinafter referred to as "TMS-TMG") were used as the component (I); and the concentrations of the respective components were set as shown in TABLE 2. Wafers were surface-treated with the prepared liquid chemicals, respectively. Then, the respective surface-treated wafers were evaluated. In Comparative Examples 7 to 11, liquid chemicals were respectively prepared in the same manner as in Examples 7 to 11, except that the component (II) was not added to the liquid chemical; wafers were surface-treated with the prepared liquid chemicals, respectively; and the respective surface-treated wafers were evaluated. The results are shown in TABLE 2.

In the table and in the following description, the abbreviation "MSTA" refers to N-trimethylsilyl-N-methylacetamide $((CH_3)_3Si$—$N(CH_3)C(=O)CH_3)$; and the abbreviation "BSA" refers to N,O-bis(trimethylsilyl)acetamide $((CH_3)_3Si$—$N$=$C(CH_3)OSi(CH_3)_3)$.

Even in each of these Examples in which two kinds of compounds, i.e., TMG and TMS-TMG were contained as the component (II), the liquid chemical also had a good water repellency imparting effect as the contact angle after the surface treatment was much larger than in the corresponding Comparative Example in which the component (II) was not contained in the liquid chemical.

TABLE 2

| | | Composition of Protective Film-Forming Liquid Chemical | | | | | | | | | | |
|---|---|---|---|---|---|---|---|---|---|---|---|---|
| | | (I)-1 | | | (I)-2 | | | (II) | | | | Evaluation Results |
| | | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | (III) | |
| | Kind | [mass %] | [mmol/ 100 g] | Kind | [mass %] | [mmol/ 100 g] | Kind | Form at 25° C. and 1 atm | [mass %] | [mmol/ 100 g] | Organic Solvent | (A) Dissolution Time | (B) Contact Angle [°] |
| Ex. 7 | MSTFA | 6.0 | 30.2 | none | — | — | TMG TMS-TMG | liquid liquid | 0.1 0.2 | 1.2 1.2 | PGMEA | ◎ | 87 |
| Ex. 8 | MSTA | 4.4 | 30.2 | none | — | — | TMG TMS-TMG | liquid liquid | 0.1 0.2 | 1.2 1.2 | PGMEA | ◎ | 64 |
| Ex. 9 | BSTFA | 7.8 | 30.2 | none | — | — | TMG TMS-TMG | liquid liquid | 0.1 0.2 | 1.2 1.2 | PGMEA | ◎ | 88 |
| Ex. 10 | BSA | 6.1 | 30.2 | none | — | — | TMG TMS-TMG | liquid liquid | 0.1 0.2 | 1.2 1.2 | PGMEA | ◎ | 84 |
| Ex. 11 | TMS-TriAz | 4.3 | 30.2 | none | — | — | TMG TMS-TMG | liquid liquid | 0.1 0.2 | 1.2 1.2 | PGMEA | ◎ | 90 |
| Comp. Ex. 7 | MSTFA | 6.0 | 30.2 | none | — | — | none | — | — | — | PGMEA | ◎ | 45 |
| Comp. Ex. 8 | MSTA | 4.4 | 30.2 | none | — | — | none | — | — | — | PGMEA | ◎ | 36 |

TABLE 2-continued

Composition of Protective Film-Forming Liquid Chemical

| | (I)-1 | | | (I)-2 | | | (II) | | | | (III) | Evaluation Results | |
|---|---|---|---|---|---|---|---|---|---|---|---|---|---|
| | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | | | | (A) Dissolution Time | (B) Contact Angle [°] |
| | Kind | [mass %] | [mmol/ 100 g] | Kind | [mass %] | [mmol/ 100 g] | Kind | Form at 25° C. and 1 atm | [mass %] | [mmol/ 100 g] | Organic Solvent | | |
| Comp. Ex. 9 | BSTFA | 7.8 | 30.2 | none | — | — | none | — | — | — | PGMEA | ◉ | <10 |
| Comp. Ex. 10 | BSA | 6.1 | 30.2 | none | — | — | none | — | — | — | PGMEA | ◉ | 61 |
| Comp. Ex. 11 | TMS-TriAz | 4.3 | 30.2 | none | — | — | none | — | — | — | PGMEA | ◉ | 74 |

Examples 12 to 18

In Examples 12 to 17, liquid chemicals were prepared in the same manner as in Example 1, except that the kind and concentration of the component (II) were changed as shown in TABLE 3; wafers were surface-treated with the prepared liquid chemicals, respectively; and the respective surface-treated wafers were evaluated. In Example 18, a liquid chemical was prepared in the same manner as in Example 4, except that the kind and concentration of the component (II) were changed as shown in TABLE 3; a wafer was surface-treated with the prepared liquid chemical; and the surface-treated wafer was evaluated. The results are shown in TABLE 3.

In the table and in the following description, the abbreviation "DPhG" refers to 1,3-diphenylguanidine; the abbreviation "TPhG" refers to 1,2,3-triphenylguanidine; and the abbreviation "DPhFA" refers to N,N'-diphenylformamidine.

TABLE 3

Composition of Protective Film-Forming Liquid Chemical

| | (I)-1 | | | (I)-2 | | | (II) | | | | (III) | Evaluation Results | |
|---|---|---|---|---|---|---|---|---|---|---|---|---|---|
| | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | | | | (A) Dissolution Time | (B) Contact Angle [°] |
| | Kind | [mass %] | [mmol/ 100 g] | Kind | [mass %] | [mmol/ 100 g] | Kind | Form at 25° C. and 1 atm | [mass %] | [mmol/ 100 g] | Organic Solvent | | |
| Ex. 12 | TMS-TFA | 5.6 | 30.2 | none | — | — | TMG | liquid | 0.3 | 2.4 | PGMEA | ◉ | 90 |
| Ex. 13 | TMS-TFA | 5.6 | 30.2 | none | — | — | TMS-TMG | liquid | 0.4 | 2.4 | PGMEA | ◉ | 93 |
| Ex. 14 | TMS-TFA | 5.6 | 30.2 | none | — | — | TMG | liquid | 0.1 | 1.2 | PGMEA | ◉ | 92 |
| | | | | | | | TMS-TMG | liquid | 0.2 | 1.2 | | | |
| Ex. 15 | TMS-TFA | 5.6 | 30.2 | none | — | — | DPhG | solid | 0.5 | 2.4 | PGMEA | ○ | 72 |
| Ex. 16 | TMS-TFA | 5.6 | 30.2 | none | — | — | TPhG | solid | 0.7 | 2.4 | PGMEA | ○ | 61 |
| Ex. 17 | TMS-TFA | 5.6 | 30.2 | none | — | — | DPhFA | solid | 0.5 | 2.4 | PGMEA | ○ | 60 |
| Ex. 18 | TMSIm | 4.2 | 30.2 | none | — | — | TMG | liquid | 0.3 | 2.4 | PGMEA | ◉ | 83 |
| Comp. Ex. 1 | TMS-TFA | 5.6 | 30.2 | none | — | — | none | — | — | — | PGMEA | ◉ | <10 |
| Comp. Ex. 4 | TMSIm | 4.2 | 30.2 | none | — | — | none | — | — | — | PGMEA | ◉ | 77 |

Even in these respective Examples, the contact angle after the surface treatment was much larger than in the corresponding Comparative Examples 1 and 4 in which the component (II) was not contained in the liquid chemical. The liquid chemicals of these Examples thus had a good water repellency imparting effect.

As is confirmed from the above results, the same tendency can be seen even when the kinds of the components (I) and (II) are variously changed.

Examples 19 to 24

In Examples 19 to 21, liquid chemicals were prepared in the same manner as in Example 1, except that two kinds of silylation agents were used in combination as shown in TABLE 4 without changing the total mole concentration of the component (I); wafers were surface-treated with the prepared liquid chemicals, respectively; and the respective surface-treated wafers were evaluated. In Examples 22 and 23, liquid chemicals were prepared in the same manner as in Example 14, except that two kinds of silylation agents were used in combination as shown in TABLE 4 without changing the total mole concentration of the component (I); wafers were surface-treated with the prepared liquid chemicals, respectively; and the respective surface-treated wafers were evaluated. In Example 24, a liquid chemical was prepared in the same manner as in Example 12, except that two kinds of silylation agents were used in combination as shown in TABLE 4 without changing the total mole concentration of the component (I); a wafer was surface-treated with the prepared liquid chemical; and the surface-treated wafer was evaluated. The results are shown in TABLE 4.

In the table and in the following description, the abbreviation "HMDS" refers to 1,1,1,3,3,3-hexamethyldisilazane.

liquid chemical. Wafers were surface-treated with the prepared liquid chemicals, respectively. Then, the respective surface-treated wafers were evaluated. The results are shown in TABLE 4.

In each of these Examples, the liquid chemical had a good water repellency imparting effect as the contact angle after the surface treatment was larger than in the corresponding Comparative Examples in which the component (II) was not contained in the liquid chemical. As is confirmed from the results of these Examples, the same tendency can be seen even when two kinds of silylation agents are used in combination as the component (I).

Further, the liquid chemicals of these Examples each had a better water repellency imparting effect than those of Examples 1, 12 and 14 in which TMS-TFA was contained solely as the component (I).

Examples 25 to 29

In Examples 25 to 27, liquid chemicals were respectively prepared in the same manner as in Examples 1, 3 and 4, except that the organic solvent component (III) was changed to butyl acetate; wafers were surface-treated with the prepared liquid chemicals, respectively; and the respective surface-treated wafers were evaluated. In Examples 28 and 29, liquid chemicals were respectively prepared in the same manner as in Examples 2 and 3, except that the organic solvent component (III) was changed to n-decane; wafers were surface-treated with the prepared liquid chemicals, respectively; and the respective surface-treated wafers were evaluated. The results are shown in TABLE 5.

Comparative Examples 15 to 19

In Comparative Examples 15 to 19, liquid chemicals were respectively prepared in the same manner as in Examples 25

TABLE 4

| | Composition of Protective Film-Forming Liquid Chemical | | | | | | | | | | | |
|---|---|---|---|---|---|---|---|---|---|---|---|---|
| | (I)-1 | | | (I)-2 | | | (II) | | | | Evaluation Results | |
| | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | (III) | (A) Dissolution Time | (B) Contact Angle [°] |
| | Kind | [mass %] | [mmol/ 100 g] | Kind | [mass %] | [mmol/ 100 g] | Kind | Form at 25° C. and 1 atm | [mass %] | [mmol/ 100 g] | Organic Solvent | | |
| Ex. 19 | TMS-TFA | 2.8 | 15.1 | MSTFA | 3.0 | 15.1 | tBu-TMG | liquid | 0.4 | 2.4 | PGMEA | ◎ | 96 |
| Ex. 20 | TMS-TFA | 2.8 | 15.1 | BSTFA | 3.9 | 15.1 | tBu-TMG | liquid | 0.4 | 2.4 | PGMEA | ◎ | 96 |
| Ex. 21 | TMS-TFA | 2.8 | 15.1 | HMDS | 2.4 | 15.1 | tBu-TMG | liquid | 0.4 | 2.4 | PGMEA | ◎ | 98 |
| Ex. 22 | TMS-TFA | 2.8 | 15.1 | MSTFA | 3.0 | 15.1 | TMG | liquid | 0.1 | 1.2 | PGMEA | ◎ | 93 |
| | | | | | | | TMS-TMG | liquid | 0.2 | 1.2 | | | |
| Ex. 23 | TMS-TFA | 2.8 | 15.1 | BSTFA | 3.9 | 15.1 | TMG | liquid | 0.1 | 1.2 | PGMEA | ◎ | 93 |
| | | | | | | | TMS-TMG | liquid | 0.2 | 1.2 | | | |
| Ex. 24 | TMS-TFA | 2.8 | 15.1 | HMDS | 2.4 | 15.1 | TMG | liquid | 0.3 | 2.4 | PGMEA | ◎ | 94 |
| Comp. Ex. 12 | TMS-TFA | 2.8 | 15.1 | MSTFA | 3.0 | 15.1 | none | — | — | — | PGMEA | ◎ | 70 |
| Comp. Ex. 13 | TMS-TFA | 2.8 | 15.1 | BSTFA | 3.9 | 15,1 | none | — | — | — | PGMEA | ◎ | 24 |
| Como. Ex. 14 | TMS-TFA | 2.8 | 15.1 | HMDS | 2.4 | 15.1 | none | — | — | — | PGMEA | ◎ | 88 |

Comparative Examples 12 to 14

In Comparative Examples 12 to 14, liquid chemicals were respectively prepared in the same manner as in Examples 19 to 21, except that the component (II) was not added to the to 29, except that the component (II) was not added to the liquid chemical. Wafers were surface-treated with the prepared liquid chemicals, respectively. Then, the respective surface-treated wafers were evaluated. The results are shown in TABLE 5.

TABLE 5

Composition of Protective Film-Forming Liquid Chemical

| | (I)-1 | | | (I)-2 | | | (II) | | | | | Evaluation Results | |
|---|---|---|---|---|---|---|---|---|---|---|---|---|---|
| | | Conc. of Component (I)-1 Based on Total Amount of Components (I) to (III) | | | Conc. of Component (I)-2 Based on Total Amount of Components (I) to (III) | | | | Conc. of Component (II) Based on Total Amount of Components (I) to (III) | | | (A) Disso- lution Time | (B) Contact Angle [°] |
| | Kind | [mass %] | [mmol/ 100 g] | Kind | [mass %] | [mmol/ 100 g] | Kind | Form at 25° C. and 1 atm | [mass %] | [mmol/ 100 g] | (III) Organic Solvent | | |
| Ex. 25 | TMS-TFA | 5.6 | 30.2 | none | — | — | tBu-TMG | liquid | 0.4 | 2.4 | butyl acetate | ◎ | 95 |
| Ex. 26 | BSTFA | 7.8 | 30.2 | none | — | — | tBu-TMG | liquid | 0.4 | 2.4 | butyl acetate | ◎ | 85 |
| Ex. 27 | TMSIm | 4.2 | 30.2 | none | — | — | tBu-TMG | liquid | 0.4 | 2.4 | butyl acetate | ◎ | 93 |
| Ex. 28 | MSTFA | 6.0 | 30.2 | none | — | — | tBu-TMG | liquid | 0.4 | 2.4 | n-decane | ◎ | 84 |
| Ex. 29 | BSTFA | 7.8 | 30.2 | nene | — | — | tBu-TMG | liquid | 0.4 | 2.4 | n-decane | ◎ | 86 |
| Comp. Ex. 15 | TMS-TFA | 5.6 | 30.2 | none | — | — | none | — | — | — | butyl acetate | ◎ | <10 |
| Comp. Ex. 16 | BSTFA | 7.8 | 30.2 | none | — | — | none | — | — | — | butyl acetate | ◎ | <10 |
| Comp. Ex. 17 | TMSIm | 4.2 | 30.2 | none | — | — | none | — | — | — | butyl acetate | ◎ | 78 |
| Comp. Ex. 13 | MSTFA | 6.0 | 30.2 | none | — | — | none | — | — | — | n-decane | ◎ | 46 |
| Comp. Ex. 19 | BSTFA | 7.8 | 30.2 | none | — | — | none | — | — | — | n-decane | ◎ | <10 |
| Ex. 30 | TMS-TFA | 5.6 | 30.2 | none | — | — | TMG | liquid | 0.3 | 2.4 | butyl acetate | ◎ | 91 |
| Ex. 31 | BSTFA | 7.8 | 30.2 | none | — | — | TMG TMS-TMG | liquid liquid | 0.1 0.2 | 1.2 1.2 | butyl acetate | ◎ | 89 |
| Ex. 32 | TMSIm | 4.2 | 30.2 | none | — | — | TMG | liquid | 0.3 | 2.4 | butyl acetate | ◎ | 88 |
| Ex. 33 | MSTFA | 6.0 | 30.2 | none | — | — | TMG TMS-TMG | liquid liquid | 0.1 0.2 | 1.2 1.2 | n-decane | ◎ | 88 |
| Ex. 34 | BSTFA | 7.8 | 30.2 | none | — | — | TMG TMS-TMG | liquid liquid | 0.1 0.2 | 1.2 1.2 | n-decane | ◎ | 86 |

Examples 30 to 34

In Examples 30 to 32, liquid chemicals were respectively prepared in the same manner as in Examples 12, 9 and 18, except that the organic solvent component (III) was changed to butyl acetate; wafers were surface-treated with the prepared liquid chemicals, respectively; and the respective surface-treated wafers were evaluated. In Examples 33 and 34, liquid chemicals were respectively prepared in the same manner as in Examples 7 and 9, except that the organic solvent component (III) was changed to n-decane; wafers were surface-treated with the prepared liquid chemicals, respectively; and the respective surface-treated wafers were evaluated. The results are shown in TABLE 5.

In each of these Examples, the liquid chemical had a good water repellency imparting effect as the contact angle after the surface treatment was much larger than in the corresponding Comparative Example in which the component (II) was not contained in the liquid chemical. As is confirmed from the results of these Examples, the same tendency can be seen even when the kind of the organic solvent as the component (III) is changed.

Among others, the dissolution time of the raw materials during the preparation of the liquid chemical in the respective Examples in which the component (II) used was liquid at 25° C. and 1.0 atmospheric pressure (e.g. Examples 1, 12 and 13) was shorter than and thus preferable to that in the respective Examples in which the component (II) used was solid at 25° C. and 1.0 atmospheric pressure (e.g. Examples 15, 16 and 17).

Reference Examples 1 to 44

Each of Reference Examples 1 to 21 was carried out as an experimental example by preparing a surface treatment material in the same manner as in Example 1 except for using a certain concentration of "silicon-free nitrogen-containing heterocyclic compound (hereinafter also simply referred to as "nitrogen-containing heterocyclic compound")" as shown in TABLE 6 without using the component (II) (tBu-TMG), surface-treating a wafer with the prepared surface treatment material, and then, evaluating the surface-treated wafer. Reference Examples 22 to 42 were experimental examples in which the kind of the organic solvent was further changed. Reference Examples 43 to 44 were experimental examples in which the kind and concentration of the silylation agent and the kind of the organic solvent were further changed. The nitrogen-containing heterocyclic compounds shown in TABLE 6 correspond to "silicon-free nitrogen-containing heterocyclic compounds" shown in Tables 1 to 3 of Patent Document 1. The results are shown in TABLE 6.

In the table, the abbreviation "Im" refers to imidazole; the abbreviation "Tet" refers to 1H-tetrazole; the abbreviation "5-MeTet" refers to 5-methyltetrazole; the abbreviation "Tri" refers to 1,2,4-triazole; the abbreviation "BzoTri" refers to 1,2,3-benzotriazole; the abbreviation "Pyr" refers to pyrazole; the abbreviation "2-MeIm" refers to 2-methylimidazole; the abbreviation "4-MeIm" refers to 4-methylimidazole; the abbreviation "TFAcIm" refers to 1-(trifluoroacetyl)imidazole; the abbreviation "3-Mer-1,2,4-Tri" refers to 3-mercapto-1,2,4-triazole; the abbreviation "5-MBzoTri" refers to 5-methyl-1H-benzotriazole; the abbreviation "5-AminoTet" refers to 5-amino-1H-tetrazole; the abbreviation "Tet-1-AcOH" refers to 1H-tetrazole-1-acetic acid; the abbreviation "Tet-5-AcOH" refers to 1H-tetrazole-5-acetic acid; the abbreviation "5-Mer-1-MeTet" refers to 5-mercapto-1-methyltetrazole; the abbreviation "5-BnTet" refers to 5-benzyl-1H-tetrazole; the abbreviation "5-PhTet" refers to 5-phenyltetrazole; the abbreviation "5-pTolTet" refers to 5-(p-tolyl)-1H-tetrazole; the abbreviation "5-Mer-1-PhTet" refers to 5-mercapto-1-phenyl-1H-tetrazole; the abbreviation "5-MeThiTet" refers to 5-(methylthio)-1H-tetrazole; and the abbreviation "iOx" refers to isoxazole.

invention had a better water repellency imparting effect when the compound of the general formula [1] was used.

Furthermore, many of the heterocyclic compounds used in the respective Reference Examples were solid at 25° C. and 1.0 atmospheric pressure and inferior in solubility; whereas the raw materials of the protective film-forming liquid chemical according to the present invention were good in solubility and, when liquid at 25° C. and 1.0 atmospheric pressure, better in solubility.

It has accordingly been shown that the protective film-forming liquid chemical according to the present invention

TABLE 6

| | Composition of Surface Treatment Material | | | | | | | Evaluation Results | |
|---|---|---|---|---|---|---|---|---|---|
| | Silylation Reagent | | | Silicon-Free Nitrogen-Containing Heterocyclic Compound | | | | (A) | (B) |
| | | | | | Form at | | | Disso- | Contact |
| | | Conc. | | | 25° C. | Conc. | | lution | Angle |
| | Kind | [mass %] | [mmol/100 g] | Kind | and 1 atm | [mass %] | [mmol/100 g] | Organic Solvent | Time | [°] |
| Ref. Ex. 1 | TMS-TFA | 5.6 | 30.2 | Im | solid | 0.2 | 2.4 | PGMEA | ○ | 88 |
| Ref. Ex. 2 | TMS-TFA | 5.6 | 30.2 | Tet | solid | 0.2 | 2.4 | PGMEA | Δ | 12 |
| Ref. Ex. 3 | TMS-TFA | 5.6 | 30.2 | 5-MeTet | solid | 0.2 | 2.4 | PGMEA | Δ | 11 |
| Ref. Ex. 4 | TMS-TFA | 5.6 | 30.2 | Tri | solid | 0.2 | 2.4 | PGMEA | X | 48 |
| Ref. Ex. 5 | TMS-TFA | 5.6 | 30.2 | BzoTri | solid | 0.3 | 2.4 | PGMEA | Δ | <10 |
| Ref. Ex. 6 | TMS-TFA | 5.6 | 30.2 | Pyr | solid | 0.2 | 2.4 | PGMEA | ○ | 39 |
| Ref. Ex. 7 | TMS-TFA | 5.6 | 30.2 | 2-MeIm | solid | 0.2 | 2.4 | PGMEA | Δ | 83 |
| Ref. Ex. 8 | TMS-TFA | 5.6 | 30.2 | 4-MeIm | solid | 0.2 | 2.4 | PGMEA | Δ | 87 |
| Ref. Ex. 9 | TMS-TFA | 5.6 | 30.2 | TFAcIm | liquid | 0.4 | 2.4 | PGMEA | ◎ | 48 |
| Ref. Ex. 10 | TMS-TFA | 5.6 | 30.2 | 3-Mer-1,2,4-Tri | solid | 0.3 | 2.4 | PGMEA | Δ | 12 |
| Ref. Ex. 11 | TMS-TFA | 5.6 | 30.2 | 5-MeBzoTri | solid | 0.3 | 2.4 | PGMEA | Δ | <10 |
| Ref. Ex. 12 | TMS-TFA | 5.6 | 30.2 | 5-AminoTet | solid | 0.2 | 2.4 | PGMEA | X | 22 |
| Ref. Ex. 13 | TMS-TFA | 5.6 | 30.2 | Tet-1-AcOH | solid | 0.3 | 2.4 | PGMEA | Δ | <10 |
| Ref. Ex. 14 | TMS-TFA | 5.6 | 30.2 | Tet-5-AcOH | solid | 0.3 | 2.4 | PGMEA | X | <10 |
| Ref. Ex. 15 | TMS-TFA | 5.6 | 30.2 | 5-Mer-1-MeTet | solid | 0.3 | 2.4 | PGMEA | Δ | <10 |
| Ref. Ex. 16 | TMS-TFA | 5.6 | 30.2 | 5-BnTet | solid | 0.4 | 2.4 | PGMEA | Δ | <10 |
| Ref. Ex. 17 | TMS-TFA | 5.6 | 30.2 | 5-PhTet | solid | 0.4 | 2.4 | PGMEA | Δ | 11 |
| Ref. Ex. 18 | TMS-TFA | 5.6 | 30.2 | 5-pTolTet | solid | 0.4 | 2.4 | PGMEA | X | <10 |
| Ref. Ex. 19 | TMS-TFA | 5.6 | 30.2 | 5-Mer-1-PhTet | solid | 0.4 | 2.4 | PGMEA | Δ | 11 |
| Ref. Ex. 20 | TMS-TFA | 5.6 | 30.2 | 5-MeThiTet | solid | 0.3 | 2.4 | PGMEA | Δ | <10 |
| Ref. Ex. 21 | TMS-TFA | 5.6 | 30.2 | iOx | liquid | 0.2 | 2.4 | PGMEA | ◎ | 11 |
| Ref. Ex. 22 | TMS-TFA | 5.6 | 30.2 | Im | solid | 0.2 | 2.4 | butyl acetate | ○ | 88 |
| Ref. Ex. 23 | TMS-TFA | 5.6 | 30.2 | Tet | solid | 0.2 | 2.4 | butyl acetate | Δ | 13 |
| Ref. Ex. 24 | TMS-TFA | 5.6 | 30.2 | 5-MeTet | solid | 0.2 | 2.4 | butyl acetate | Δ | 10 |
| Ref. Ex. 25 | TMS-TFA | 5.6 | 30.2 | Tri | solid | 0.2 | 2.4 | butyl acetate | X | 58 |
| Ref. Ex. 26 | TMS-TFA | 5.6 | 30.2 | BzoTri | solid | 0.3 | 2.4 | butyl acetate | Δ | <10 |
| Ref. Ex. 27 | TMS-TFA | 5.6 | 30.2 | Pyr | solid | 0.2 | 2.4 | butyl acetate | ○ | 40 |
| Ref. Ex. 28 | TMS-TFA | 5.6 | 30.2 | 2-MeIm | solid | 0.2 | 2.4 | butyl acetate | Δ | 81 |
| Ref. Ex. 29 | TMS-TFA | 5.6 | 30.2 | 4-MeIm | solid | 0.2 | 2.4 | butyl acetate | Δ | 87 |
| Ref. Ex. 30 | TMS-TFA | 5.6 | 30.2 | TFAcIm | liquid | 0.4 | 2.4 | butyl acetate | ◎ | 46 |
| Ref. Ex. 31 | TMS-TFA | 5.6 | 30.2 | 3-Mer-1,2,4-Tri | solid | 0.3 | 2.4 | butyl acetate | X | 12 |
| Ref. Ex. 32 | TMS-TFA | 5.6 | 30.2 | 5-MeBzoTri | solid | 0.3 | 2.4 | butyl acetate | X | <10 |
| Ref. Ex. 33 | TMS-TFA | 5.6 | 30.2 | 5-AminoTet | solid | 0.2 | 2.4 | butyl acetate | X | 22 |
| Ref. Ex. 34 | TMS-TFA | 5.6 | 30.2 | Tet-1-AcOH | solid | 0.3 | 2.4 | butyl acetate | X | <10 |
| Ref. Ex. 35 | TMS-TFA | 5.6 | 30.2 | Tet-5-AcOH | solid | 0.3 | 2.4 | butyl acetate | X | 29 |
| Ref. Ex. 36 | TMS-TFA | 5.6 | 30.2 | 5-Mer-1-MeTet | solid | 0.3 | 2.4 | butyl acetate | X | <10 |
| Ref. Ex. 37 | TMS-TFA | 5.6 | 30.2 | 5-BnTet | solid | 0.4 | 2.4 | butyl acetate | X | <10 |
| Ref. Ex. 33 | TMS-TFA | 5.6 | 30.2 | 5-PhTet | solid | 0.4 | 2.4 | butyl acetate | X | <10 |
| Ref. Ex. 39 | TMS-TFA | 5.6 | 30.2 | 5-pTolTet | solid | 0.4 | 2.4 | butyl acetate | X | <10 |
| Ref. Ex. 40 | TMS-TFA | 5.6 | 30.2 | 5-Mer-1-PhTet | solid | 0.4 | 2.4 | butyl acetate | X | <10 |
| Ref. Ex. 41 | TMS-TFA | 5.6 | 30.2 | 5-MeThiTet | solid | 0.3 | 2.4 | butyl acetate | X | <10 |
| Ref. Ex. 42 | TMS-TFA | 5.6 | 30.2 | iOx | liquid | 0.2 | 2.4 | butyl acetate | ◎ | <10 |
| Ref. Ex. 43 | MSTFA | 6.0 | 30.2 | Im | solid | 0.2 | 2.4 | n-decane | Δ | 86 |
| Ref. Ex. 44 | BSTFA | 7.8 | 30.2 | Im | solid | 0.2 | 2.4 | n-decane | Δ | 86 |

In Reference Examples 1 to 44, the nitrogen-containing heterocyclic compound was used in place of the component (II) as mentioned above. In some of these Reference Examples, the water repellency imparting effect was inferior. On the other hand, the protective film-forming liquid chemical according to the present invention had a good water repellency imparting effect. In particular, the protective film-forming liquid chemical according to the present invention had a better water repellency imparting effect when the compound of the general formula [1] was used.

achieves a good water repellency imparting effect and good raw material solubility in a well-balanced manner.

DESCRIPTION OF REFERENCE NUMERALS

1: Wafer
2: Fine uneven pattern on wafer surface
3: Projection portion of pattern 4: Recess portion of pattern
5: Width of recess portion
6: Height of projection portion
7: Width of projection portion
8: Water-repellent protective film-forming liquid chemical retained in recess portion 4
9: Liquid retained in recess portion 4
10: Protective film

The invention claimed is:

1. A water-repellent protective film-forming liquid chemical for forming a water-repellent protective film on a surface of a wafer, the surface of the wafer containing a silicon element, the water-repellent protective film-forming liquid chemical comprising:
(I) a silylation agent;
(II) at least one kind of nitrogen-containing compound selected from the group consisting of those of the following general formulas [1] and [2]:

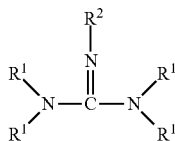
[1]

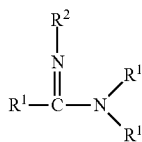
[2]

where $R^1$ is each independently a hydrogen atom, a —C≡N group, a —NO$_2$ group, or a hydrocarbon group in which a part or all of hydrogen atoms may be substituted with a fluorine atom; the hydrocarbon group as $R^1$ may contain an oxygen atom and/or a nitrogen atom, and has an acyclic structure when containing a nitrogen atom; $R^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as $R^2$ may contain an oxygen atom and/or a nitrogen atom, and has an acyclic structure when containing a nitrogen atom; and
(III) an organic solvent,
wherein the silylation agent contains at least one kind selected from the group consisting of compounds of the following general formulas [3] to [6];

[3]

where $R^3$ is each independently a monovalent hydrocarbon group of 1 to 18 carbon atoms in which a part or all of hydrogen atoms may be substituted with a fluorine atom; $R^4$ is each independently an alkyl group of 1 to 6 carbon atoms in which a part or all of hydrogen atoms may be substituted with a fluorine atom; a is 3; b is an integer of 0 to 2; and the sum of a and b is 3 or less,

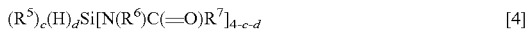
[4]

where $R^5$ is each independently a monovalent hydrocarbon group of 1 to 18 carbon atoms in which a part or all of hydrogen atoms may be substituted with a fluorine atom; $R^6$ is each independently an alkyl group of 1 to 6 carbon atoms in which a part or all of hydrogen atoms may be substituted with a fluorine atom, or a hydrogen atom; $R^7$ is each independently an alkyl group of 1 to 6 carbon atoms in which a part or all of hydrogen atoms may be substituted with a fluorine atom; c is 3; d is an integer of 0 to 2; and the sum of c and d is 3 or less,

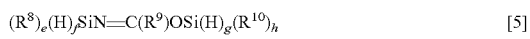
[5]

where $R^8$ and $R^{10}$ are each independently a monovalent hydrocarbon group of 1 to 18 carbon atoms in which a part or all of hydrogen atoms may be substituted with a fluorine atom; $R^9$ is an alkyl group of 1 to 6 carbon atoms in which a part or all of hydrogen atoms may be substituted with a fluorine atom, or a hydrogen atom; and e and h are each 3; f and g are each an integer of 0 to 2; and the sum of e and f and the sum of g and h are both 3,

[6]

where $R^{11}$ is each independently a monovalent hydrocarbon group of 1 to 18 carbon atoms in which a part or all of hydrogen atoms may be substituted with a fluorine atom; i is 3; j is an integer of 0 to 2; the sum of i and j is 3; Y is a monovalent nitrogen-containing heterocyclic group which may have a substituent, and.

2. The water-repellent protective film-forming liquid chemical according to claim 1, wherein the component (II) is liquid at 25° C. and 1.0 atmospheric pressure.

3. The water-repellent protective film-forming chemical liquid according to claim 1,
wherein the silylation agent further contains at least one kind selected from the group consisting of compounds of the following general formula [7]

[7]

where $R^{12}$ is each independently a monovalent hydrocarbon group of 1 to 18 carbon atoms in which a part or all of hydrogen atoms may be substituted with a fluorine atom; k is an integer of 1 to 3; l is an integer of 0 to 2; and the sum of k and l is 3.

4. The water-repellent protective film-forming chemical liquid according to claim 1, wherein the concentration of the component (II) is 0.01 to 30 mass % based on 100 mass % of the total amount of the components (I) to (III).

5. The water-repellent protective film-forming chemical liquid according to claim 1, wherein, in the general formulas [1] and [2], $R^1$ is a hydrogen atom, an alkyl group of 1 to 6 carbon atoms or an alkoxy group of 1 to 6 carbon atoms, and $R^2$ is a hydrogen atom, an alkyl group of 1 to 6 carbon atoms, an alkoxy group of 1 to 6 carbon atoms or an alkylsilyl group of the following general formula [8]

[8]

where $R^{13}$ is each independently a hydrocarbon group of 1 to 18 carbon atoms; m and n are each an integer of 0 to 3; and the sum of m and n is 3.

6. The water-repellent protective film-forming chemical liquid according to claim 1, wherein the component (II) contains at least one kind of nitrogen-containing compound selected from the group consisting of those of the general formula [1].

7. The water-repellent protective film-forming chemical liquid according to claim 3, wherein k in the general formula [7] is 3.

8. The water-repellent protective film-forming chemical liquid according to claim 1,
wherein at least two of $R^3$ in the general formula [3] are methyl;
wherein at least two of $R^5$ in the general formula [4] are methyl;
wherein, in the general formula [5], at least two of $R^8$ are methyl, and at least two of $R^{10}$ are methyl; and
wherein at least two of $R^{11}$ in the general formula [6] are methyl.

9. The water-repellent protective film-forming chemical liquid according to claim 3, wherein at least two of $R^{12}$ in the general formula [7] are methyl.

10. The water-repellent protective film-forming chemical liquid according to claim 1, wherein the concentration of the component (I) is 1 to 50 mass % based on 100 mass % of the total amount of the components (I) to (III).

11. The water-repellent protective film-forming chemical liquid according to claim 1, wherein the organic solvent as the component (III) is an aprotic solvent.

12. A method of preparing a water-repellent protective film-forming liquid chemical for forming a water-repellent protective film on a surface of a wafer, the surface of the wafer containing a silicon element, the method comprising:
mixing at least the following components under conditions of 15 to 35° C. and 0.5 to 1.5 atmospheric pressure:
(I) a silylation agent;
(II) at least one kind of nitrogen-containing compound selected from the group consisting of those of the following general formulas [1] and [2]:

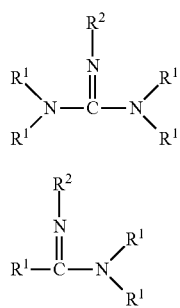

where $R^1$ is each independently a hydrogen atom, a —C≡N group, a —NO$_2$ group, or a hydrocarbon group in which a part or all of hydrogen atoms may be substituted with a fluorine atom; the hydrocarbon group as $R^1$ may contain an oxygen atom and/or a nitrogen atom, and has an acyclic structure when containing a nitrogen atom; $R^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as $R^2$ may contain an oxygen atom and/or a nitrogen atom, and has an acyclic structure when containing a nitrogen atom; and
(III) an organic solvent,
wherein the silylation agent contains at least one kind selected from the group consisting of compounds of the following general formulas [3] to [6]:

where $R^3$ is each independently a monovalent hydrocarbon group of 1 to 18 carbon atoms in which a part or all of hydrogen atoms may be substituted with a fluorine atom; $R^4$ is each independently an alkyl group of 1 to 6 carbon atoms in which a part or all of hydrogen atoms may be substituted with a fluorine atom; a is 3; b is an integer of 0 to 2; and the sum of a and b is 3 or less,

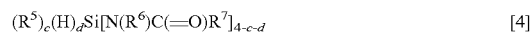

where $R^5$ is each independently a monovalent hydrocarbon group of 1 to 18 carbon atoms in which a part or all of hydrogen atoms may be substituted with a fluorine atom; $R^6$ is each independently an alkyl group of 1 to 6 carbon atoms in which a part or all of hydrogen atoms may be substituted with a fluorine atom, or a hydrogen atom; $R^7$ is each independently an alkyl group of 1 to 6 carbon atoms in which a part or all of hydrogen atoms may be substituted with a fluorine atom; c is 3; d is an integer of 0 to 2; and the sum of c and d is 3 or less,

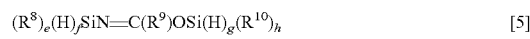

where $R^8$ and $R^{10}$ are each independently a monovalent hydrocarbon group of 1 to 18 carbon atoms in which a part or all of hydrogen atoms may be substituted with a fluorine atom; $R^9$ is an alkyl group of 1 to 6 carbon atoms in which a part or all of hydrogen atoms may be substituted with a fluorine atom, or a hydrogen atom; and e and h are each 3; f and g are each an integer of 0 to 2; and the sum of e and f and the sum of g and h are both 3,

where $R^{11}$ is each independently a monovalent hydrocarbon group of 1 to 18 carbon atoms in which a part or all of hydrogen atoms may be substituted with a fluorine atom; i is 3; j is an integer of 0 to 2; the sum of i and j is 3; Y is a monovalent nitrogen-containing heterocyclic group which may have a substituent, and.

13. A method of manufacturing a surface-treated body, comprising surface-treating a workpiece by bringing the water-repellent protective film-forming liquid chemical according to claim 1 into contact with a surface of the workpiece.

14. A water-repellent protective film-forming liquid chemical for forming a water-repellent protective film on a surface of a wafer, the surface of the wafer containing a silicon element, the water-repellent protective film-forming liquid chemical comprising:
(I) a silylation agent;
(II) at least one kind of nitrogen-containing compound selected from the group consisting of those of the following general formulas [1] and [2]:

-continued

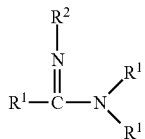
[2]

where $R^1$ is each independently a hydrogen atom, a —C≡N group, a —NO$_2$ group, or a hydrocarbon group in which a part or all of hydrogen atoms may be substituted with a fluorine atom; the hydrocarbon group as $R^1$ may contain an oxygen atom and/or a nitrogen atom, and has an acyclic structure when containing a nitrogen atom; $R^2$ is a hydrogen atom, a —C≡N group, a —NO$_2$ group, an alkylsilyl group, or a hydrocarbon group in which a part or all of hydrogen atoms may be substituted with a fluorine atom; and the hydrocarbon group as $R^2$ may contain an oxygen atom and/or a nitrogen atom, and has an acyclic structure when containing a nitrogen atom; and (III) an organic solvent, wherein the silylation agent contains at least one compound selected from the group consisting of compounds of the following general formulas [3] to [6]:

$(R^3)_a(H)_b\text{Si}[OC(=O)R^4]_{4-a-b}$ [3]

where $R^3$ is each independently a monovalent hydrocarbon group of 1 to 18 carbon atoms in which a part or all of hydrogen atoms may be substituted with a fluorine atom; $R^4$ is each independently an alkyl group of 1 to 6 carbon atoms in which a part or all of hydrogen atoms may be substituted with a fluorine atom; a is an integer of 1 to 3; b is an integer of 0 to 2; and the sum of a and b is 3 or less, $(R^5)_c(H)_d\text{Si}[N(R^6)C(=O)R^7]_{4-c-d}$ [4]

where $R^5$ is each independently a monovalent hydrocarbon group of 1 to 18 carbon atoms in which a part or all of hydrogen atoms may be substituted with a fluorine atom; $R^6$ is each independently an alkyl group of 1 to 6 carbon atoms in which a part or all of hydrogen atoms may be substituted with a fluorine atom, or a hydrogen atom; $R^7$ is each independently an alkyl group of 1 to 6 carbon atoms in which a part or all of hydrogen atoms may be substituted with a fluorine atom; c is an integer of 1 to 3; d is an integer of 0 to 2; and the sum of c and d is 3 or less, $(R^8)_e(H)_f\text{SiN}=C(R^9)O\text{Si}(H)_g(R^{10})_h$ [5]

where $R^8$ and $R^{10}$ are each independently a monovalent hydrocarbon group of 1 to 18 carbon atoms in which a part or all of hydrogen atoms may be substituted with a fluorine atom; $R^9$ is an alkyl group of 1 to 6 carbon atoms in which a part or all of hydrogen atoms may be substituted with a fluorine atom, or a hydrogen atom; and e and h are each an integer of 1 to 3; f and g are each an integer of 0 to 2; and the sum of e and f and the sum of g and h are both 3, $(R^{11})_i(H)_j\text{Si}-Y$ [6]

where $R^{11}$ is each independently a monovalent hydrocarbon group of 1 to 18 carbon atoms in which a part or all of hydrogen atoms may be substituted with a fluorine atom; i is an integer of 1 to 3; j is an integer of 0 to 2; the sum of i and j is 3; Y is a monovalent nitrogen-containing heterocyclic group which may have a substituent, and wherein the silylation agent further contains at least one kind selected from the group consisting of compounds of the following general formula [7]

$[(R^{12})_k(H)_l\text{Si}]_2\text{NH}$ [7]

where $R^{12}$ is each independently a monovalent hydrocarbon group of 1 to 18 carbon atoms in which a part or all of hydrogen atoms may be substituted with a fluorine atom; k is an integer of 1 to 3; l is an integer of 0 to 2; and the sum of k and l is 3.

* * * * *